(12) United States Patent
Hara et al.

(10) Patent No.: US 12,125,856 B2
(45) Date of Patent: Oct. 22, 2024

(54) ACTIVE MATRIX SUBSTRATE AND LIQUID CRYSTAL DISPLAY DEVICE

(71) Applicant: Sharp Display Technology Corporation, Kameyama (JP)

(72) Inventors: Yoshihito Hara, Kameyama (JP); Tohru Daitoh, Kameyama (JP); Jun Nishimura, Kameyama (JP); Kengo Hara, Kameyama (JP); Yohei Takeuchi, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 89 days.

(21) Appl. No.: 18/140,593

(22) Filed: Apr. 27, 2023

(65) Prior Publication Data
US 2023/0352493 A1   Nov. 2, 2023

(30) Foreign Application Priority Data
Apr. 28, 2022   (JP) ................. 2022-074743

(51) Int. Cl.
*H01L 27/12*   (2006.01)
*G02F 1/1333*   (2006.01)
(Continued)

(52) U.S. Cl.
CPC ...... *H01L 27/1248* (2013.01); *G02F 1/13338* (2013.01); *G02F 1/133512* (2013.01); *G02F 1/1337* (2013.01); *G02F 1/134372* (2021.01); *G02F 1/136204* (2013.01); *G02F 1/136227* (2013.01); *G02F 1/136286* (2013.01); *G02F 1/1368* (2013.01); *G06F 3/0412* (2013.01);
(Continued)

(58) Field of Classification Search
CPC ............ G02F 1/1337; G02F 1/133711; G02F 1/133345; G02F 1/134372; G02F 2201/121; H01L 27/1248; G06F 3/0412; G06F 3/0445; G06F 3/0446
See application file for complete search history.

(56) References Cited

U.S. PATENT DOCUMENTS

2012/0138922 A1* 6/2012 Yamazaki ............. H01L 29/045
257/43
2013/0126876 A1   5/2013 Shin et al.
(Continued)

FOREIGN PATENT DOCUMENTS

JP   2012-134475 A   7/2012
JP   2013-109347 A   6/2013
(Continued)

*Primary Examiner* — Angela K Davison
(74) *Attorney, Agent, or Firm* — ScienBiziP, P.C.

(57) ABSTRACT

An active matrix substrate includes a thin film transistor including an oxide semiconductor layer, an interlayer insulating layer covering the thin film transistor, a pixel electrode provided above the interlayer insulating layer and electrically connected to the thin film transistor, a common electrode provided between the pixel electrode and the interlayer insulating layer, a first dielectric layer provided between the common electrode and the pixel electrode, and an alignment film covering the pixel electrode. The first dielectric layer includes a plurality of openings each of which exposes a part of the common electrode and includes the alignment film positioned therein.

8 Claims, 27 Drawing Sheets

(51) Int. Cl.
   *G02F 1/1335*   (2006.01)
   *G02F 1/1337*   (2006.01)
   *G02F 1/1343*   (2006.01)
   *G02F 1/1362*   (2006.01)
   *G02F 1/1368*   (2006.01)
   *G06F 3/041*    (2006.01)
   *G06F 3/044*    (2006.01)

(52) U.S. Cl.
   CPC ........ *G06F 3/04164* (2019.05); *G06F 3/0446* (2019.05)

(56) References Cited

U.S. PATENT DOCUMENTS

| | | |
|---|---|---|
| 2013/0320334 A1 | 12/2013 | Yamazaki et al. |
| 2014/0286076 A1 | 9/2014 | Aoki et al. |
| 2016/0253023 A1 | 9/2016 | Aoyama et al. |
| 2018/0348554 A1* | 12/2018 | Zhou ............... G02F 1/1343 |

FOREIGN PATENT DOCUMENTS

| | | |
|---|---|---|
| JP | 2014-007399 A | 1/2014 |
| JP | 2014-209727 A | 11/2014 |
| WO | 2016136271 A1 | 9/2016 |

* cited by examiner

| PHOTOLITHOGRAPHY PROCESS | |
|---|---|
| FIRST METAL LAYER | DEPOSIT OF FIRST CONDUCTIVE FILM |
| | PHOTOLITHOGRAPHY |
| | WET ETCHING |
| | PEELING |
| | DEPOSIT OF GATE INSULATING LAYER |
| OXIDE SEMICONDUCTOR LAYER | DEPOSIT OF OXIDE SEMICONDUCTOR FILM |
| | PHOTOLITHOGRAPHY |
| | WET ETCHING |
| | PEELING |
| GATE INSULATING LAYER | PHOTOLITHOGRAPHY |
| | DRY ETCHING |
| | PEELING |
| SECOND METAL LAYER | DEPOSIT OF SECOND CONDUCTIVE FILM |
| | PHOTOLITHOGRAPHY |
| | DRY ETCHING |
| | PEELING |
| | DEPOSIT OF INORGANIC INSULATING FILM |
| ORGANIC INSULATING LAYER | PHOTOLITHOGRAPHY OF ORGANIC INSULATING LAYER |
| | BAKING ORGANIC INSULATING LAYER |
| | DRY ETCHING OF ORGANIC INSULATING LAYER/INORGANIC INSULATING FILM |
| THIRD METAL LAYER | DEPOSIT OF THIRD CONDUCTIVE FILM |
| | PHOTOLITHOGRAPHY |
| | WET ETCHING |
| | PEELING |
| SECOND DIELECTRIC LAYER | DEPOSIT OF SECOND DIELECTRIC FILM |
| | PHOTOLITHOGRAPHY |
| | DRY ETCHING (FIRST DIELECTRIC LAYER) |
| | PEELING |
| FIRST TRANSPARENT CONDUCTIVE LAYER | DEPOSIT OF FIRST TRANSPARENT CONDUCTIVE FILM |
| | PHOTOLITHOGRAPHY |
| | WET ETCHING |
| | PEELING |
| FIRST DIELECTRIC LAYER | DEPOSIT OF FIRST DIELECTRIC FILM |
| | PHOTOLITHOGRAPHY |
| | DRY ETCHING (FIRST DIELECTRIC LAYER/SECOND DIELECTRIC LAYER) |
| | PEELING |
| SECOND TRANSPARENT CONDUCTIVE LAYER | DEPOSIT OF SECOND TRANSPARENT CONDUCTIVE FILM |
| | PHOTOLITHOGRAPHY |
| | WET ETCHING |
| | PEELING |

FIG. 15

ACTIVE MATRIX SUBSTRATE AND LIQUID CRYSTAL DISPLAY DEVICE

CROSS-REFERENCE TO RELATED APPLICATIONS

This application claims the benefit of priority to Japanese Patent Application Number 2022-074743 filed on Apr. 28, 2022. The entire contents of the above-identified application are hereby incorporated by reference.

BACKGROUND

Technical Field

The disclosure relates to an active matrix substrate and a liquid crystal display device.

In a liquid crystal display device including an active matrix substrate, a pixel electrode and a switching element are provided for each pixel. As the switching element, for example, a Thin Film Transistor (hereinafter, referred to as a "TFT") is used. In each pixel, a TFT is electrically connected to the pixel electrode. There is proposed use of an oxide semiconductor as a material of an active layer of the TFT, in place of amorphous silicon and polycrystalline silicon. In the specification, a portion of the active matrix substrate corresponding to the pixel in the liquid crystal display device may be referred to as a "pixel region" or "pixel", and the TFT provided as the switching element in each pixel may be referred to as the "pixel TFT".

As a display mode of the liquid crystal display device, a transverse electrical field mode such as a Fringe Field Switching (FFS) mode may be employed. In the transverse electrical field mode, a pair of electrodes (pixel electrode and common electrode) are provided in the active matrix substrate to apply an electrical field to a liquid crystal layer in a direction parallel to a substrate plane (transverse direction).

In the FFS mode, a structure in which the common electrode is disposed at an upper layer of the pixel electrode (hereinafter, referred to as a "common upper layer structure") may be employed, or a structure in which the common electrode is disposed at a lower layer of the pixel electrode (hereinafter, referred to as a "common lower layer structure") may be employed. An active matrix substrate having the common lower layer structure is described in, for example, JP 2013-109347 A.

On the other hand, in recent years, display devices provided with touch sensors (called "touch panels") have been widely used in smartphones, tablet portable terminals, and the like. Various types of touch sensors are known, such as a resistive film type, an electrostatic capacitive type, an optical type, and the like. The electrostatic capacitive touch sensor electrically detects a change in an electrostatic capacitance due to contact or approximation of an object (for example, a finger) to determine whether the display device is in a touched state. Examples of the electrostatic capacitive touch sensor include a self-capacitance type that detects a change in an electrostatic capacitance generated between an electrode for the touch sensor and the object (for example, the finger), and a mutual-capacitance type that generates an electrical field using a pair of electrodes (a transmitter electrode and a receiver electrode) for the touch sensor to detect a change in the electrical field between the electrodes.

When a touch sensor function is incorporated into a liquid crystal display device of the FFS mode, the common electrode provided in the active matrix substrate can be divided into a plurality of segments, and each segment can function as an electrode for a touch sensor (hereinafter, referred to as a "sensor electrode") of the self-capacitance type. Each touch sensor electrode is electrically connected to a corresponding touch wiring line (for driving or detecting the touch sensor). A liquid crystal display device of the FFS mode with a touch sensor function is disclosed in, for example, WO 2016/136271.

SUMMARY

In a liquid crystal display device including an active matrix substrate having a common lower layer structure, charges are accumulated at an interface between a pixel electrode and an alignment film, which causes a residual DC voltage. Among touch panels using liquid crystal display devices, in a touch panel called an "in-cell type", an amount of charges accumulated at the interface between the pixel electrode and the alignment film tends to increase for a reason, which will be described later. In addition, even in a liquid crystal display device other than the in-cell type touch panel, depending on its specification or the like, a time constant may be large, and a residual DC voltage due to charges accumulated at the interface between the pixel electrode and the alignment film may be likely to be generated.

Embodiments of the disclosure is made in view of the above problems and an object thereof is to provide an active matrix substrate having a common lower layer structure in which charges accumulated at an interface between a pixel electrode and an alignment film are easily removed compared with the related art.

The specification discloses an active matrix substrate and a liquid crystal display device described in the following items.

Item 1

An active matrix substrate including;
a substrate;
a plurality of thin film transistors supported by the substrate, each of the plurality of thin film transistors including an oxide semiconductor layer;
an interlayer insulating layer covering the plurality of thin film transistors;
a plurality of pixel electrodes provided above the interlayer insulating layer, each of the plurality of pixel electrodes being electrically connected to a corresponding one of the plurality of thin film transistors;
a common electrode provided between the plurality of pixel electrodes and the interlayer insulating layer;
a first dielectric layer provided between the common electrode and the plurality of pixel electrodes; and
an alignment film covering the plurality of pixel electrodes, wherein
the first dielectric layer includes a plurality of openings, each of the plurality of openings exposing a part of the common electrode, each of the plurality of openings including the alignment film positioned in each opening.

Item 2

The active matrix substrate according to item 1, wherein an entirety of each of the plurality of openings overlaps the common electrode when viewed from a substrate plane normal direction of the substrate.

Item 3

The active matrix substrate according to item 1, wherein each of the plurality of openings includes a portion overlapping the common electrode and a portion not overlapping the common electrode when viewed from a substrate plane normal direction of the substrate.

Item 4

The active matrix substrate according to any one of items 1 to 3, wherein
the plurality of openings are formed at an arrangement density equal to or more than 1 opening/mm$^2$.

Item 5

The active matrix substrate according to any one of items 1 to 3, wherein
the plurality of openings are formed at an arrangement density equal to or more than 4 openings/mm$^2$.

Item 6

The active matrix substrate according to any one of items 1 to 5, further including:
a plurality of touch wiring lines for touch sensor provided between the interlayer insulating layer and the common electrode; and
a second dielectric layer provided between the interlayer insulating layer and the common electrode in a manner of covering the plurality of touch wiring lines, wherein
the common electrode includes a plurality of common electrode portions each of which is configured to function as an electrode for touch sensor.

Item 7

The active matrix substrate according to any one of items 1 to 6, wherein
the oxide semiconductor layer includes an In—Ga—Zn—O-based semiconductor.

Item 8

A liquid crystal display device including:
the active matrix substrate according to any one of items 1 to 7;
a counter substrate facing the active matrix substrate; and
a liquid crystal layer provided between the active matrix substrate and the counter substrate.

Item 9

The liquid crystal display device according to item 8, wherein
the counter substrate includes a black matrix, and
an entirety of each of the plurality of openings of the first dielectric layer overlaps the black matrix when viewed from a substrate plane normal direction of the substrate.

Item 10

The liquid crystal display device according to item 8, wherein
the counter substrate includes a black matrix, and
each of the plurality of openings of the first dielectric layer includes a portion overlapping the black matrix and a portion not overlapping the black matrix when viewed from a substrate plane normal direction of the substrate.

According to embodiments of the disclosure, there is provided an active matrix substrate having a common lower layer structure in which charges accumulated at an interface between a pixel electrode and an alignment film are easily removed compared with that in the related art.

BRIEF DESCRIPTION OF DRAWINGS

The disclosure will be described with reference to the accompanying drawings, wherein like numbers reference like elements.

FIG. 15 is a flowchart illustrating the manufacturing method of the active matrix substrate 101.

DESCRIPTION OF EMBODIMENTS

Hereinafter, embodiments of the disclosure will be described with reference to the accompanying drawings. Note that the disclosure is not limited to the embodiments to be described below.

First Embodiment

Overall Structure of Active Matrix Substrate

Figure 1A:
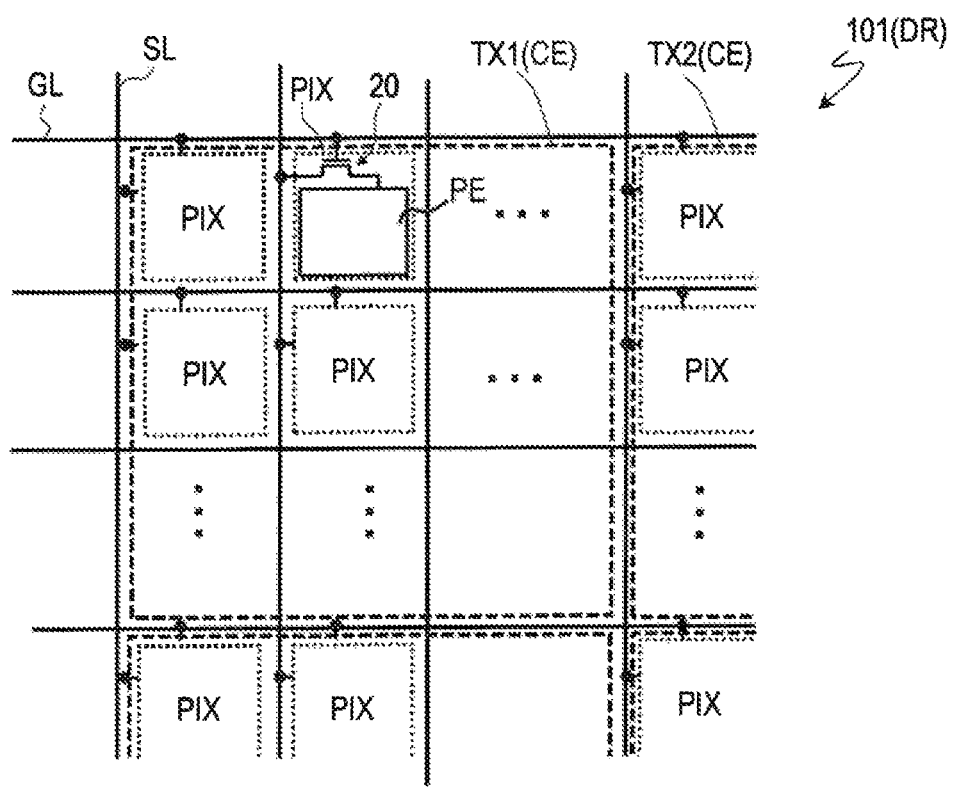
FIG. 1A is a plan view schematically illustrating an active matrix substrate 101 according to an embodiment of the disclosure.
Figure 1B:
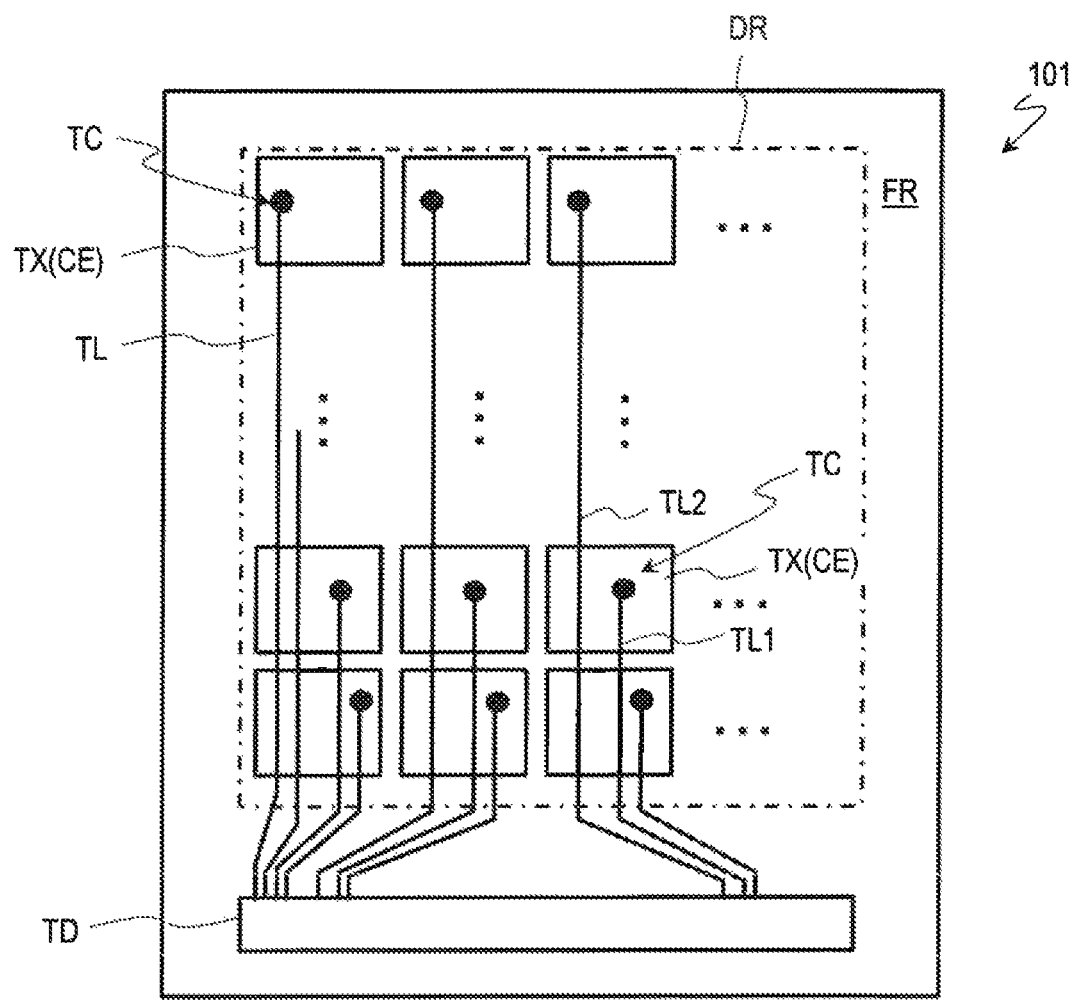
FIG. 1B is a plan view illustrating an arrangement relationship between touch sensor electrodes and touch wiring lines in the active matrix substrate 101 as an example.

First, an outline of an active matrix substrate 101 according to the present embodiment will be described with reference to FIG. 1A and FIG. 1B. The active matrix substrate 101 exemplified here is used for an in-cell type touch panel using a liquid crystal display device of an FFS mode. FIG. 1A is a plan view schematically illustrating the active matrix substrate 101, and FIG. 1B is a plan view illustrating an arrangement relationship between touch sensor electrodes and touch wiring lines in the active matrix substrate 101 as an example.

The active matrix substrate 101 includes a display region DR and a non-display region FR. The display region DR is defined by a plurality of pixel regions PIX arrayed in a matrix including a plurality of rows and a plurality of columns. The pixel region PIX is a region corresponding to each pixel in the liquid crystal display device. The non-display region FR is positioned at the periphery of the display region DR, and may be referred to as a "peripheral region" or "frame region".

The display region DR includes a plurality of gate bus lines GL extending substantially in parallel in a row direction, and a plurality of source bus lines SL extending substantially in parallel in a column direction. The column direction is a direction intersecting (typically being orthogonal to) the row direction. Each of the plurality of pixel regions PIX is typically a region defined by two gate bus lines GL adjacent to each other and two source bus lines SL adjacent to each other.

Each pixel region PIX is provided with a TFT (pixel TFT) 30 and a pixel electrode PE. The TFT 30 is supplied with a gate signal from a corresponding gate bus line GL, and is supplied with a source signal from a corresponding source bus line SL. The pixel electrode PE is electrically connected to the TFT 30.

The active matrix substrate 101 is also provided with a common electrode CE. Here, the common electrode CE is divided into a plurality of segments TX1, TX2, . . . TX(n) (n is an integer of two or greater). Each of the segments (common electrode portions) TX1 and TX2 functions as a touch sensor electrode. In the example illustrated in FIG. 1A, each of the touch sensor electrodes TX1 and TX2 (hereinafter, may be collectively referred to as a "touch sensor electrode TX") is provided corresponding to two or more pixel regions PIX.

As illustrated in FIG. 1B, the active matrix substrate 101 includes a plurality of touch wiring lines TL. Each touch sensor electrode TX is electrically connected to a corresponding touch wiring line TL. A connection section TC between the touch sensor electrode TX and the touch wiring line TL is referred to as a "touch wiring line contact portion".

The touch wiring line TL is connected to a touch drive unit TD provided in the non-display region FR. The touch drive unit TD is configured to switch, for example, between a display mode in which the plurality of touch sensor electrodes TX function as the common electrode CE, and a touch detection mode in which the plurality of touch sensor electrodes TX function as the touch sensor electrode TX, by time sharing. The touch drive unit TD, for example, applies a common signal to the touch sensor electrode TX (common electrode CE) through the touch wiring line TL in the display mode. On the other hand, in the touch detection mode, the touch drive unit TD applies a touch drive signal to the touch sensor electrode TX through the touch wiring line TL.

In the illustrated example, the plurality of touch wiring lines TL extend, for example, in the column direction (the same direction as the source bus lines SL). Some touch wiring lines TL extend across one or a plurality of other touch sensor electrodes TX to the corresponding touch sensor electrodes TX.

When attention is paid to one touch sensor electrode TX, a first touch wiring line TL1 (see FIG. 1B) for supplying a signal to the one touch sensor electrode TX extends to the touch wiring line contact portion TC, and a second touch wiring line TL2 (see FIG. 1B) for supplying a signal to another touch sensor electrode TX extends across the one touch sensor electrode TX. As will be described later, the second touch wiring line TL2 and the touch sensor electrode TX1 overlap each other with an insulating layer (dielectric layer) interposed therebetween. Note that, as illustrated in FIG. 1B, depending on a position of the touch sensor electrode TX, two or more touch wiring lines TL may be arranged so as to extend across the touch sensor electrode TX, or no touch wiring line may be arranged so as to cross the touch sensor electrode TX.

Note that, although not illustrated, in the non-display region FR in the active matrix substrate 101, in addition to the touch drive unit TD, a peripheral circuit including drive circuits such as a gate driver that supplies a gate signal to the gate bus line GL, a source driver that supplies a source signal to the source bus line SL, and the like is provided. These drive circuits may, for example, be mounted on the active matrix substrate 101, or formed as an integral (monolithic) part. A semiconductor chip including some or all of the drive circuits may be mounted on the non-display region FR.

The non-display region FR is also provided with a source terminal section, a gate terminal section, a source-gate connection section, and the like. The source-gate connection section is a connection section that electrically connects a wiring line formed in the same metal layer as the source bus line and a wiring line formed in the same metal layer as the gate bus line.

Structure of Pixel Region PIX in Active Matrix Substrate 101

Figure 2A:
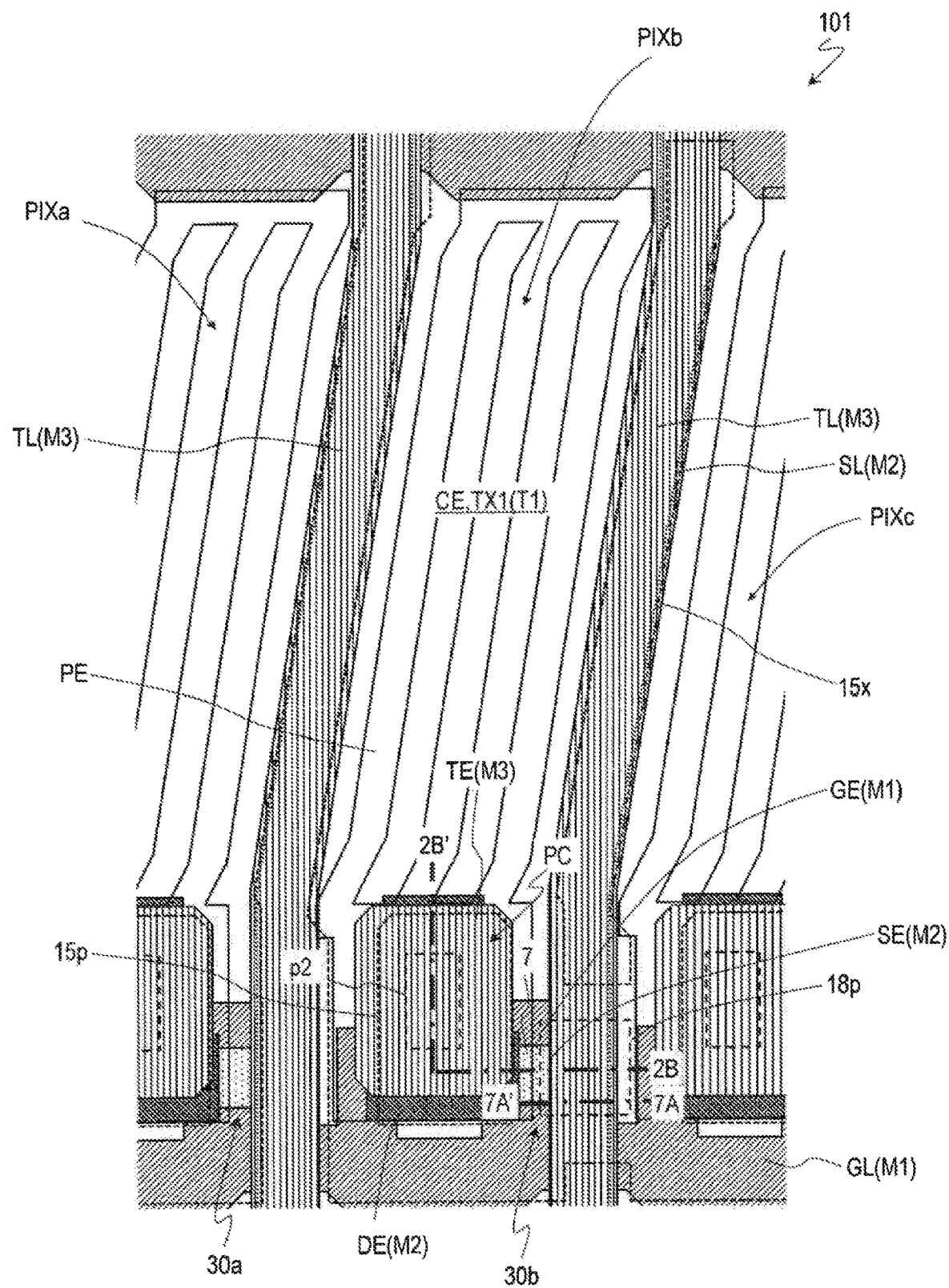
FIG. 2A is a plan view illustrating a part of a display region DR in the active matrix substrate 101.
Figure 2B:
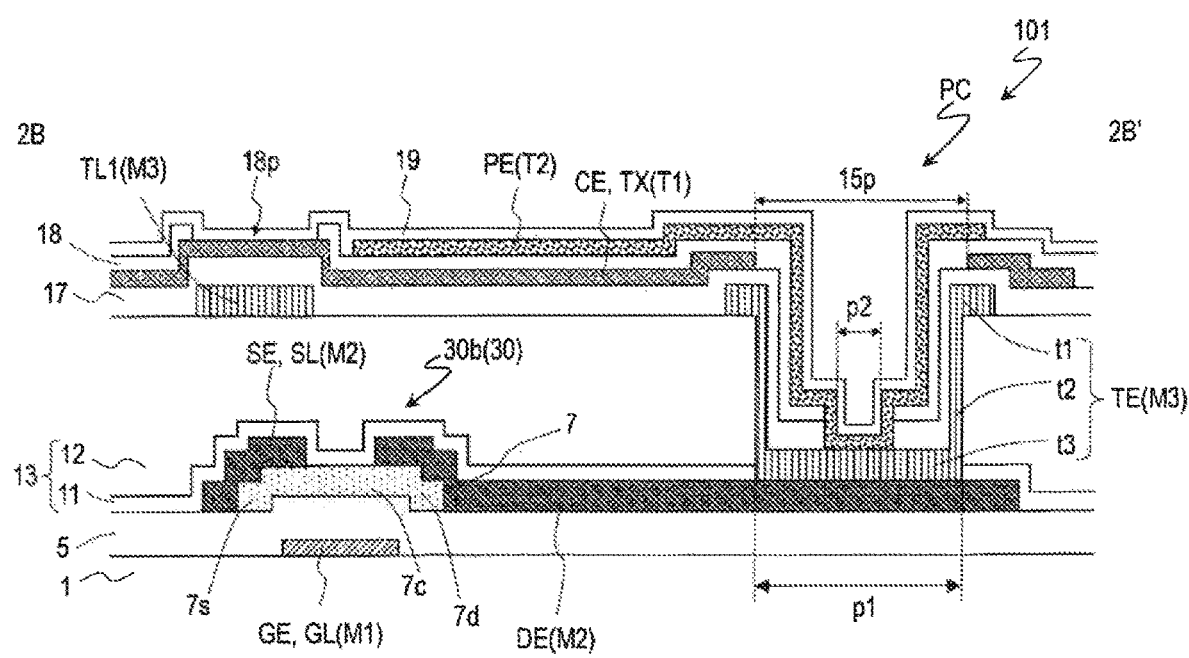
FIG. 2B is a cross-sectional view schematically illustrating the active matrix substrate 101, taken along a line 2B-2B' in FIG. 2A.
Figure 2C:
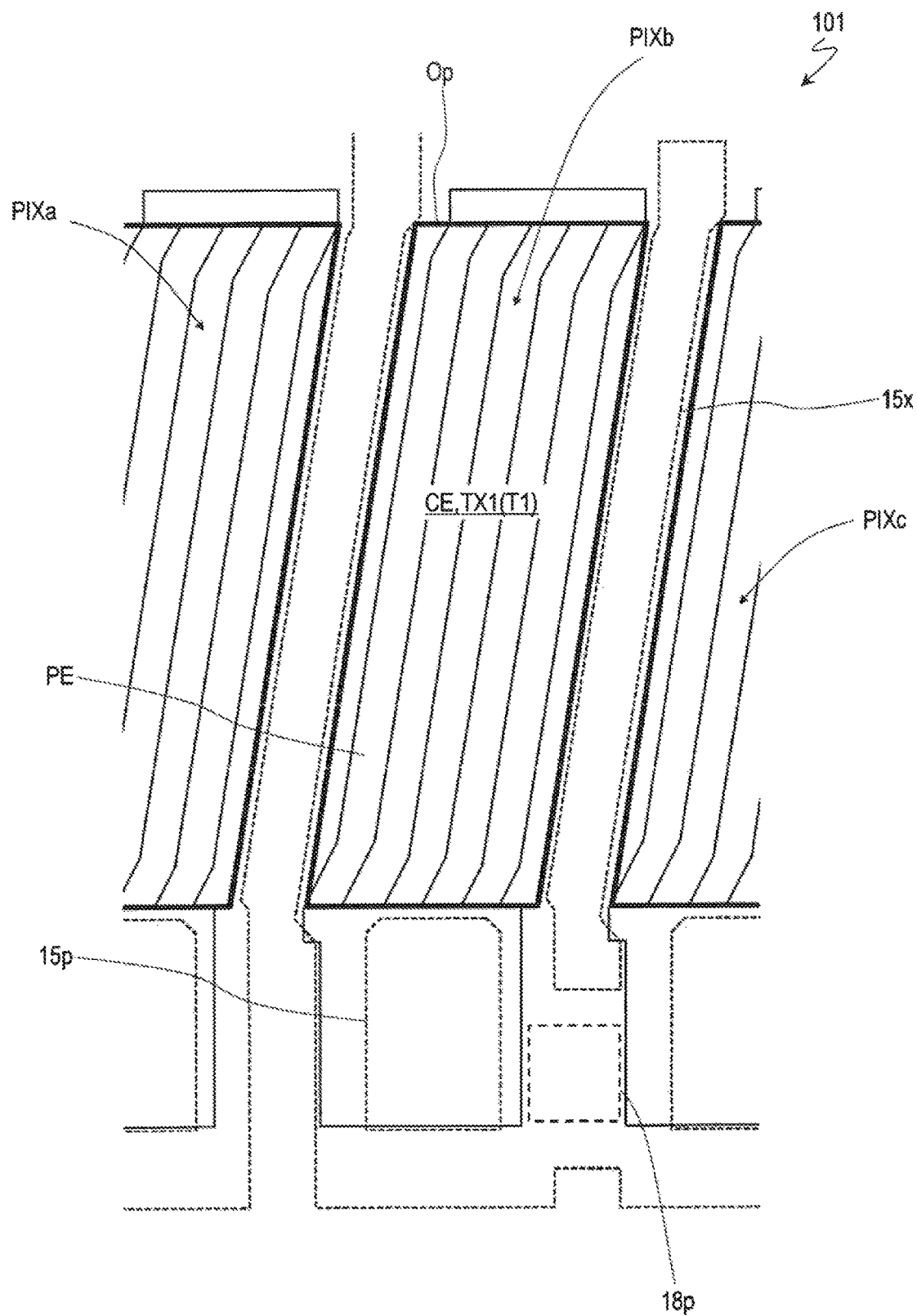
FIG. 2C is a plan view illustrating a part of the display region DR in the active matrix substrate 101, and illustrates only some of the constituent elements.

Next, a structure of the pixel region PIX in the active matrix substrate 101 will be described with reference to FIG. 2A, FIG. 2B, and FIG. 2C. FIG. 2A is a plan view illustrating a part of the display region DR in the active matrix substrate 101, and FIG. 2B is a cross-sectional view taken along a line 2B-2B' in FIG. 2A. FIG. 2C is a plan view illustrating a part of the display region DR in the active matrix substrate 101, and illustrates only some constituent elements. In addition, in FIG. 2C, a portion (also referred to as an opening of a black matrix) Op provided at a side of a counter substrate and not formed with the black matrix is also illustrated.

As described above, the display region DR in the active matrix substrate 101 includes the plurality of gate bus lines GL extending in the row direction, and the plurality of source bus lines SL extending in the column direction. Additionally, the display region DR is defined by a plurality of pixel regions PIX arrayed in a matrix.

The active matrix substrate 101 is provided with a substrate 1, the TFT 30 supported by the substrate 1, the pixel electrode PE, and the common electrode CE. Each TFT 30 may be electrically connected to the corresponding pixel electrode PE, and a part of the TFT 30 may be positioned outside the corresponding pixel region PIX.

FIG. 2A illustrates three pixel regions PIXa, PIXb, and PIXc adjacent to each other in the row direction among the plurality of pixel regions PIX. In FIG. 2A, a TFT 30a corresponding to the pixel region PIXa, and a TFT 30b corresponding to the pixel region PIXb are illustrated.

In this specification, a layer M1 including electrodes and wiring lines formed using the same conductive film (first conductive film) as the gate bus line GL is referred to as a "first metal layer", and a layer M2 including electrodes and wiring lines formed using the same conductive film (second conductive film) as the source bus line SL is referred to as a "second metal layer". Further, a layer M3 including electrodes and wiring lines formed using the same conductive film as the touch wiring line TL (third conductive film) is referred to as a "third metal layer". In addition, a layer T1 including electrodes and wiring lines formed using the same conductive film (first transparent conductive film) as the common electrode CE is referred to as a "first transparent conductive layer", and a layer T2 including electrodes and wiring lines formed using the same conductive film (second transparent conductive film) as the pixel electrode PE is referred to as a "second transparent conductive layer". In the drawings, a reference sign for each of constituent elements may be followed by a sign indicating the metal layer or the transparent conductive layer in parentheses. For example, "(M1)" may be added after the reference sign of the electrode or wiring line formed in the first metal layer M1.

The TFT 30 is provided with a gate electrode GE, an oxide semiconductor layer 7, a gate insulating layer 5 arranged between the oxide semiconductor layer 7 and the gate electrode GE, and a source electrode SE and a drain electrode DE that are electrically connected to the oxide semiconductor layer 7. The gate electrode GE overlaps at least part of the oxide semiconductor layer 7 with the gate insulating layer 5 interposed therebetween.

In this example, the TFT 30 is a bottom gate oxide semiconductor TFT. The gate electrode GE is arranged between the oxide semiconductor layer 7 and the substrate 1. The gate insulating layer 5 covers the gate electrode GE. The oxide semiconductor layer 7 is arranged on the gate insulating layer 5 so as to overlap the gate electrode GE with the gate insulating layer 5 interposed therebetween.

The oxide semiconductor layer 7 has a source contact region 7s, a drain contact region 7d, and a channel region 7c. The source contact region 7s is electrically connected to the source electrode SE, and the drain contact region 7d is electrically connected to the drain electrode DE. The source electrode SE may be in direct contact with the source contact region 7s, and the drain electrode DE may be in direct contact with the drain contact region 7d. The channel region 7c refers to a region that is positioned between the source contact region 7s and the drain contact region 7d and that overlaps the gate electrode GE.

The gate electrode GE is electrically connected to the corresponding gate bus line GL, and the source electrode SE is electrically connected to the corresponding source bus line SL. The drain electrode DE is electrically connected to the corresponding pixel electrode PE in a pixel contact portion PC.

The gate electrode GE may be formed in the same layer (first metal layer) as the gate bus line GL, or may be a part of the corresponding gate bus line GL. The source electrode SE and the drain electrode DE may be formed in the same layer (second metal layer) as the source bus line SL. The source electrode SE may be a part of the corresponding source bus line SL.

The TFT 30 is covered with an interlayer insulating layer 13. In the illustrated example, the interlayer insulating layer 13 has a layered structure including an inorganic insulating layer (passivation film) 11 and an organic insulating layer 12 arranged on the inorganic insulating layer 11. The organic insulating layer 12 may have a thickness (for example, equal to or greater than 1 μm) sufficient to function as a flattening film.

The plurality of touch wiring lines TL are provided on the interlayer insulating layer 13. Each touch wiring line TL may be arranged so as to overlap, for example, one source bus line SL among the plurality of source bus lines SL with the interlayer insulating layer 13 interposed therebetween. In other words, the touch wiring line TL may extend above the source bus line SL along the source bus line SL (that is, in the column direction).

A second dielectric layer 17 is arranged on the interlayer insulating layer 13 so as to cover the third metal layer M3 including the touch wiring line TL. The common electrode CE is provided on the second dielectric layer 17. The common electrode CE includes an opening 15p in a region where the pixel contact portion PC is formed in each pixel region PIX. In the illustrated example, the common electrode CE may further include a plurality of openings 15x extending along the source bus line SL. Each touch sensor electrode TX may correspond to two or more pixel regions PIX.

Each touch sensor electrode TX is electrically connected to the corresponding one or more touch wiring lines TL in an opening formed in the second dielectric layer 17 in a touch wiring line contact portion not illustrated. The touch wiring line contact portion may be arranged on an intersection of the source bus line SL and the gate bus line GL. Further, for one touch sensor electrode TX, it is sufficient that at least one touch wiring line contact portion is provided, and two or more touch wiring line contact portions may be provided.

The common electrode CE (touch sensor electrode TX) is covered with the first dielectric layer 18. The pixel electrode PE is arranged on the first dielectric layer 18 for each pixel region PIX. Each pixel electrode PE includes at least one slit or notched portion.

The pixel electrode PE is arranged on the first dielectric layer 18 in each pixel region PIX so as to partially overlap the common electrode CE with the first dielectric layer 18 interposed therebetween. Each pixel electrode PE is electrically connected to the drain electrode DE of the TFT 30 in the pixel contact portion PC, which will be described later. At a portion where the pixel electrode PE and the common electrode CE overlap each other, an auxiliary capacity (transparent auxiliary capacity) is formed by using the common electrode CE, the pixel electrode PE, and the first dielectric layer 18 positioned between these electrodes.

As described above, the pixel electrode PE is provided above the interlayer insulating layer 13, and the common electrode CE is provided between the pixel electrode PE and the interlayer insulating layer 13. The touch wiring line TL is provided between the interlayer insulating layer 13 and the common electrode CE. The first dielectric layer 18 is provided between the common electrode CE and the pixel electrode PE, and the second dielectric layer 17 is provided between the interlayer insulating layer 13 and the common electrode CE so as to cover the touch wiring line TL. Additionally, an alignment film 19 is provided so as to cover the pixel electrode PE.

Pixel Contact Portion PC

As illustrated in FIG. 2A and FIG. 2B, the pixel contact portion PC for electrically connecting the drain electrode DE of the TFT 30 and the pixel electrode PE is arranged in each pixel region PIX. In the illustrated example, the pixel electrode PE is connected to the drain electrode DE through a connection electrode TE formed by using the same third conductive film as the touch wiring line TL (that is, formed in the third metal layer M3).

Each pixel contact portion PC includes the drain electrode DE of the TFT 30, the interlayer insulating layer 13 extending on the drain electrode DE, the connection electrode TE formed in the third metal layer M3, both the first dielectric layer 18 and the second dielectric layer 17 that extend on the connection electrode TE, and the pixel electrode PE. The interlayer insulating layer 13 includes a lower opening p1 that exposes a part of the drain electrode DE. The connection electrode TE is electrically connected to the drain electrode DE in the lower opening p1. The connection electrode TE may be in direct contact with the exposed portion of the drain electrode DE in the lower opening p1. The first dielectric layer 18 and the second dielectric layer 17 include an upper opening p2 that exposes a part of the connection electrode TE. The pixel electrode PE is electrically connected to the connection electrode TE in the upper opening p2. The pixel electrode PE may be in direct contact with the exposed portion of the connection electrode TE in the upper opening p2.

The third metal layer M3 including the touch wiring line TL is arranged closer to the substrate 1 side than the common electrode CE. Thus, the third metal layer M3 can be used for forming the pixel contact portion PC. Specifically, when the pixel contact portion PC is formed, in a state where the drain electrode DE is covered with the connection electrode TE, the first transparent conductive film is patterned to form the common electrode CE. Thus, in the process of patterning the first transparent conductive film to form the common electrode CE, damage to the drain electrode DE due to contact of the etching solution (for example, oxalic acid) with the drain electrode DE can be suppressed.

The connection electrode TE may include a first portion t1 in contact with a part of an upper face of the interlayer insulating layer 13, a second portion t2 in contact with a side surface of the lower opening p1, and a third portion t3 in contact with the exposed portion of the drain electrode DE. This makes it possible to more effectively protect the exposed portion of the drain electrode DE exposed by the lower opening p1. In particular, when the interlayer insulating layer 13 includes the organic insulating layer 12, it is preferable that the connection electrode TE not only cover the exposed portion of the drain electrode DE, but also cover a side surface of the organic insulating layer 12. As a result, it is possible to suppress the penetration of an etching solution into the drain electrode DE more effectively. In addition, corrosion of the drain electrode DE due to moisture contained in the organic insulating layer 12 can be suppressed. The side surface of the lower opening p1 includes the side surface of the inorganic insulating layer 11 and the side surface of the organic insulating layer 12. As illustrated in the figure, the second portion t2 of the connection electrode TE may cover the entire side surface of the lower opening p1. In this case, the first dielectric layer 17 does not need to be in contact with the side surface of the lower opening p1.

Further, as will be described below, according to the exemplified configuration, the pixel aperture ratio can be improved and/or the capacitance value of an auxiliary capacity can be increased compared with the existing active matrix substrate having the common lower layer structure.

As a configuration for suppressing damage to the drain electrode, a configuration is conceivable in which a conductive layer (referred to as a "transparent connection layer") covering the exposed surface of the drain electrode is formed from the same transparent conductive film as the common electrode, and the pixel electrode and the drain electrode of the pixel TFT are connected by using the transparent connection layer. However, in this configuration, the transparent connection layer is formed in the same layer as the common electrode, and thus, the transparent connection layer needs to be formed in an opening in the common electrode so as to be sufficiently separated from the common electrode.

In contrast, in the exemplified configuration, the connection electrode TE is formed in a layer different from the common electrode CE, and the first dielectric layer 17 that is an insulating layer is interposed between the connection electrode TE and the common electrode CE. In this way, when viewed from the substrate plane normal direction of the substrate 1, the connection electrode TE and the common electrode CE can be electrically separated without spacing between the connection electrode TE and the common electrode CE. Thus, a distance between the connection electrode TE and the common electrode CE in a plane parallel to the substrate 1 can be made small, so that a decrease in the pixel aperture ratio and a decrease in the auxiliary capacity Cp due to the pixel contact portion PC can be suppressed. When viewed from the substrate plane normal direction of the substrate 1, the connection electrode TE and the common electrode CE may partially overlap each other. By arranging the connection electrode TE and the common electrode CE so as to partially overlap each other with the second dielectric layer 17 interposed therebetween, the pixel aperture ratio can be further improved and the capacitance value of the auxiliary capacity Cp can be further increased. For example, in the configuration exemplified in FIG. 2B, in each pixel contact portion PC, the common electrode CE at least partially overlaps the first portion t1 of the connection electrode TE. The opening 15p in the common electrode CE may be positioned at least above the third portion t3 of the connection electrode TE.

Opening of First Dielectric Layer 18

In the active matrix substrate 101 according to the present embodiment, the first dielectric layer 18 includes a plurality of openings 18p each of which exposes a part of the common electrode CE, as illustrated in FIG. 2A and FIG. 2B. As illustrated in FIG. 2B, the alignment film 19 is positioned in each opening 18p. When viewed from the substrate plane normal direction of the substrate 1, the entirety of each opening 18p overlaps the common electrode CE. In addition, as illustrated in FIG. 2C, when viewed from the substrate plane normal direction of the substrate 1, the entirety of each opening 18p overlaps the black matrix (in other words, does not overlap an opening Op of the black matrix). In the illustrated example, the opening 18p is formed in a region overlapping the TFT 30.

Figure 3:
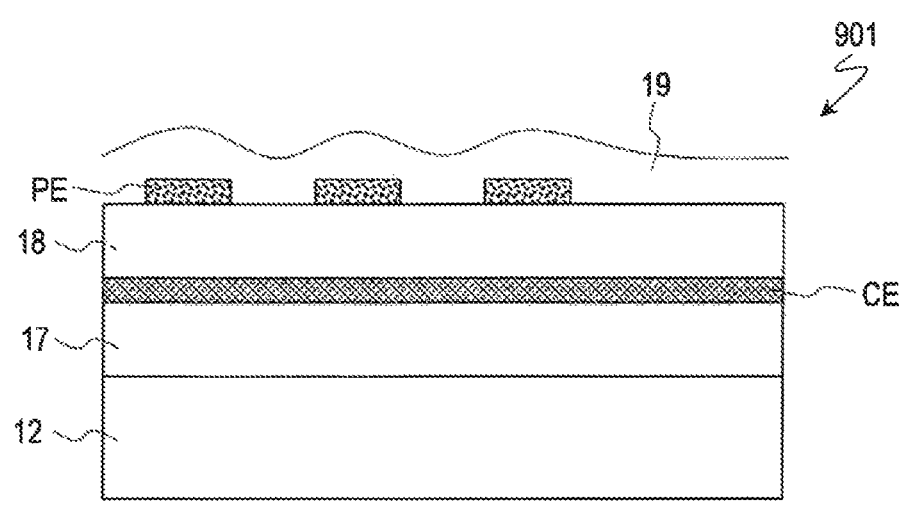
FIG. 3 is a cross-sectional view schematically illustrating an active matrix substrate 901 of a comparative example.

As described above, in the in-cell type touch panel, an amount of charges accumulated at the interface between the pixel electrode and the alignment film tends to be large. This is because, in the liquid crystal display device of the FFS mode, a transparent conductive film for preventing electrification may be provided at a side of a front surface (the side opposite to the liquid crystal layer side) of the counter substrate, and a sheet resistance thereof needs to be set high for sensing. In addition, since the connection to the common electrode CE is achieved only with the touch wiring line TL for each segment TX, a speed at which charges are released is low. Specifically, while a sheet resistance of an ITO film provided on a counter substrate in a liquid crystal display device of a vertical electrical field mode is equal to or less than several hundreds $\Omega/\square$, a sheet resistance of an ITO film provided at the counter substrate side for preventing electrification in the in-cell type touch panel of the FFS mode is about from $1\times10^6$ to $1\times10^8 \Omega/\square$. As in an active matrix substrate 901 of a comparative example illustrated in FIG. 3, in a case where the first dielectric layer 18 is not formed with an opening that exposes the common electrode CE, electrical insulation is achieved between the common electrode CE and the alignment film 19 and between the common electrode CE and the pixel electrode PE by the first dielectric layer 18, so that charges accumulated at the interface between the pixel electrode PE and the alignment film 19 are less likely to be released.

Figure 4:
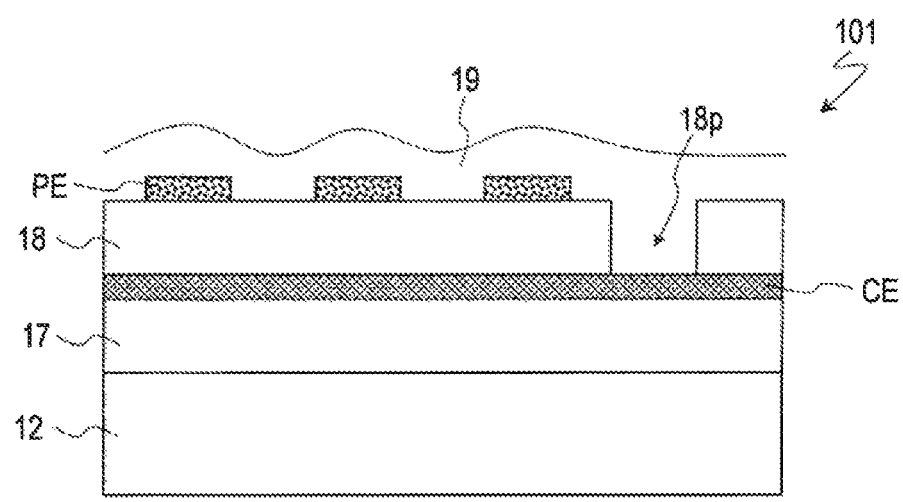
FIG. 4 is a cross-sectional view schematically illustrating the active matrix substrate 101.

On the other hand, in the active matrix substrate 101 according to the present embodiment, since the first dielectric layer 18 includes the opening 18p as described above, paths exist between the common electrode CE and the alignment film 19 and between the common electrode CE and the pixel electrode PE without the first dielectric layer 18 interposed therebetween as illustrated in FIG. 4, so that charges accumulated at the interface between the pixel electrode PE and the alignment film 19 are more likely to be released. Thus, a residual DC component (residual DC voltage) can be removed.

The opening 18p has, for example, a substantially rectangular shape of about 5 μm square, but the size and shape of the opening 18p are obviously not limited thereto. For example, the opening 18p may have a substantially polygonal shape, a substantially circular shape, a substantially elliptical shape, or the like. In addition, it is considered that the larger the size (area) of the opening 18p is, the more easily charges are released. However, when the size of the opening 18p is too large, the opening 18p may include a portion that does not overlap the black matrix, or may include a portion that does not overlap the common electrode CE when viewed from the substrate plane normal direction of the substrate 1. When the opening 18p includes a portion that does not overlap the black matrix, a decrease in contrast ratio may occur due to a step caused by the opening 18p. In addition, when the opening 18p includes a portion that does not overlap the common electrode CE, the opening 18p is made deep. Thus, an alignment film material is unlikely to enter into the opening 18p, so that a path through which charges are released may be unlikely to be formed. An area of each opening 18p is, for example, equal to or more than 4 μm² and equal to or less than 100 μm². When each opening 18p has a substantially square shape, one side thereof is, for example, equal to or greater than 2 μm and equal to or less than 10 μm.

In addition, the opening 18p does not need to be formed corresponding to each pixel region PIX. From the viewpoint of easily allowing the charges accumulated at the interface between the pixel electrode PE and the alignment film 19 to be sufficiently released, the opening 18p is preferably formed at an arrangement density being equal to or more than 1 opening/mm², and more preferably formed at an arrangement density being equal to or more than 4 openings/mm².

Figure 5:
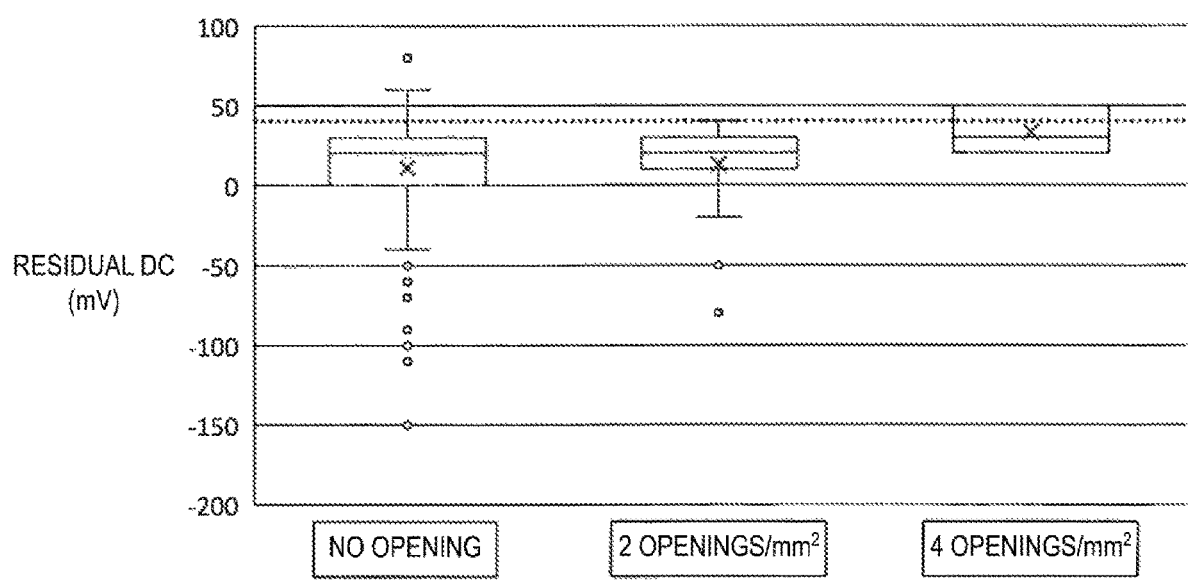
FIG. 5 is a graph (box-and-whisker plot) showing residual DC-voltage values actually measured in a case where an opening 18$p$ is not formed in a first dielectric layer 18, a case where openings 18$p$ with 5 μm square are formed at an arrangement density of 2 openings/mm$^2$, and a case where openings 18$p$ with 5 μm square are formed at an arrangement density of 4 openings/mm$^2$.

FIG. 5 is a graph showing residual DC-voltage values actually measured in a case where no opening 18p is formed in the first dielectric layer 18, a case where the openings 18p with 5 μm square are formed at an arrangement density of 2 openings/mm², and a case where the openings 18p with 5 μm square are formed at an arrangement density of 4 openings/mm². It can be seen from FIG. 5 that the residual-DC voltage is improved by forming the openings 18p, and that the residual DC-voltage value is closer to an appropriate value (+40 mV) in the case where the arrangement density is 4 openings/mm² than the case where the arrangement density is 2 openings/mm².

It should be noted that the arrangement density of the openings 18p is preferably high from the viewpoint of making it easy for the charges to be sufficiently released, but when the arrangement density is too high, a wettability of the alignment film material may decrease, and thus, the arrangement density of the openings 18p is preferably set to such an extent that the wettability of the alignment film material does not decrease so much.

Configuration of Touch Panel

The active matrix substrate 101 according to the present embodiment is used for an in-cell type touch panel.

Figure 6:
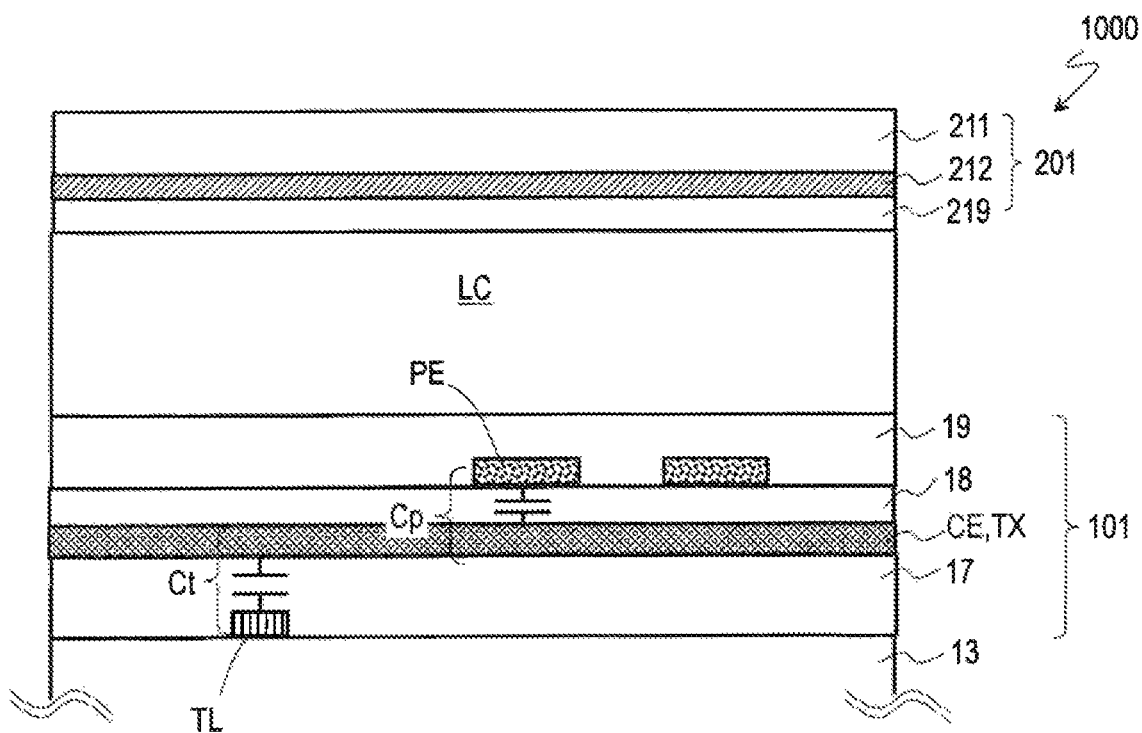
FIG. 6 is a cross-sectional view schematically illustrating a touch panel (liquid crystal display device) 1000 using the active matrix substrate 101.

FIG. 6 is a schematic cross-sectional view illustrating a part of a touch panel (liquid crystal display device) 1000 using the active matrix substrate 101 according to the present embodiment as an example.

The touch panel 1000 includes the active matrix substrate 101, a counter substrate 201 arranged so as to face the active matrix substrate 101, and a liquid crystal layer LC provided between the active matrix substrate 101 and the counter substrate 201.

As described above, the active matrix substrate 101 includes the TFT 30 (not illustrated) arranged for each pixel region PIX, the touch wiring line TL arranged on the interlayer insulating layer 13 covering the TFT 30, the second dielectric layer 17 that covers the touch wiring line TL, the common electrode CE arranged on the second dielectric layer 17, the first dielectric layer 18 that covers the common electrode CE, and the pixel electrode PE arranged on the first dielectric layer 18. The common electrode CE also functions as the touch sensor electrode TX. Here, a cross section including one touch sensor electrode TX and the touch wiring line TL electrically connected to a touch sensor electrode TX other than the one touch sensor electrode TX is illustrated. The alignment film 19 is formed at the liquid crystal layer LC side of the active matrix substrate 101 so as to cover the pixel electrode PE.

As illustrated in the figure, a touch wiring line capacity Ct is formed by using the touch sensor electrode TX (common electrode CE), the second dielectric layer 17, and the touch wiring line TL. Further, the transparent auxiliary capacity Cp is formed by using the common electrode CE, the first dielectric layer 18, and the pixel electrode PE.

The counter substrate 201 includes a substrate 211, a color filter layer 212, and a black matrix not illustrated. An alignment film 219 is provided at the liquid crystal layer LC side of the color filter layer 212.

According to the present embodiment, thicknesses of dielectrics in the touch wiring line capacity Ct and the transparent auxiliary capacity Cp can be controlled independently, and thus, these capacities can be optimized. Thus, it is possible to achieve both sensing performance and display performance.

In order to achieve a desired display performance (display quality), it is preferable to increase the transparent auxiliary capacity Cp, that is, to reduce a thickness of the first dielectric layer 18. On the other hand, it is preferable that the thickness of the dielectric in the touch wiring line capacity Ct (here, a thickness of the second dielectric layer 17) be larger. When the dielectric becomes thinner, the touch wiring line capacity Ct increases, which may degrade a signal output from the touch wiring line TL. According to the present embodiment, by increasing only the thickness of the second dielectric layer 17 while maintaining the thickness of the first dielectric layer 18 at a predetermined thickness, the touch wiring line capacity Ct can be reduced while the capacitance value of the transparent auxiliary capacity Cp is being ensured. Thus, it is possible to suppress the deterioration of a signal output from the touch wiring line TL due to the touch wiring line capacity Ct while ensuring high display performance.

Although the thicknesses of the second dielectric layer 17 and the first dielectric layer 18 are not particularly limited, when both the second dielectric layer 17 and the first dielectric layer 18 are formed of SiN films, the thickness of the second dielectric layer 17 may be, for example, equal to or greater than 150 nm and equal to or less than 500 nm, and the thickness of the first dielectric layer 18 may be, for example, equal to or greater than 90 nm and equal to or less than 200 nm. The second dielectric layer 17 may be thicker than the first dielectric layer 18.

Figure 7:
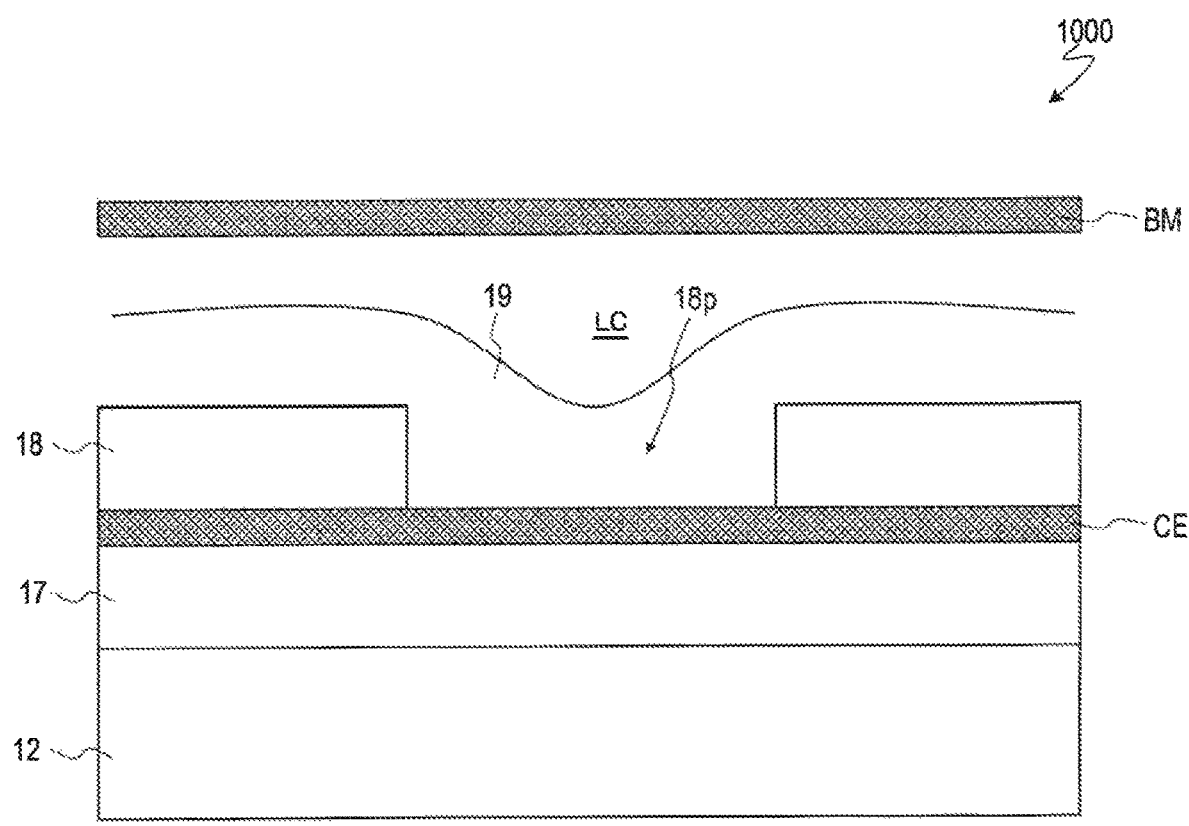
FIG. 7 is a cross-sectional view illustrating a portion at or near the opening 18$p$ in the touch panel 1000, and corresponds to a cross section taken along a line 7A-7A' in FIG. 2A.

FIG. 7 illustrates a cross section at or near the opening 18p in the touch panel 1000 (corresponds to a cross section taken along a line 7A-7A' in FIG. 2A). In the example illustrated in FIG. 7, the entirety of the opening 18p of the first dielectric layer 18 overlaps a black matrix BM when viewed from the substrate plane normal direction of the substrate 1. Since the entirety of the opening 18p overlaps the black matrix BM, it is possible to suppress a decrease in contrast ratio due to a step caused by the opening 18p.

Modified Example

Figure 8:
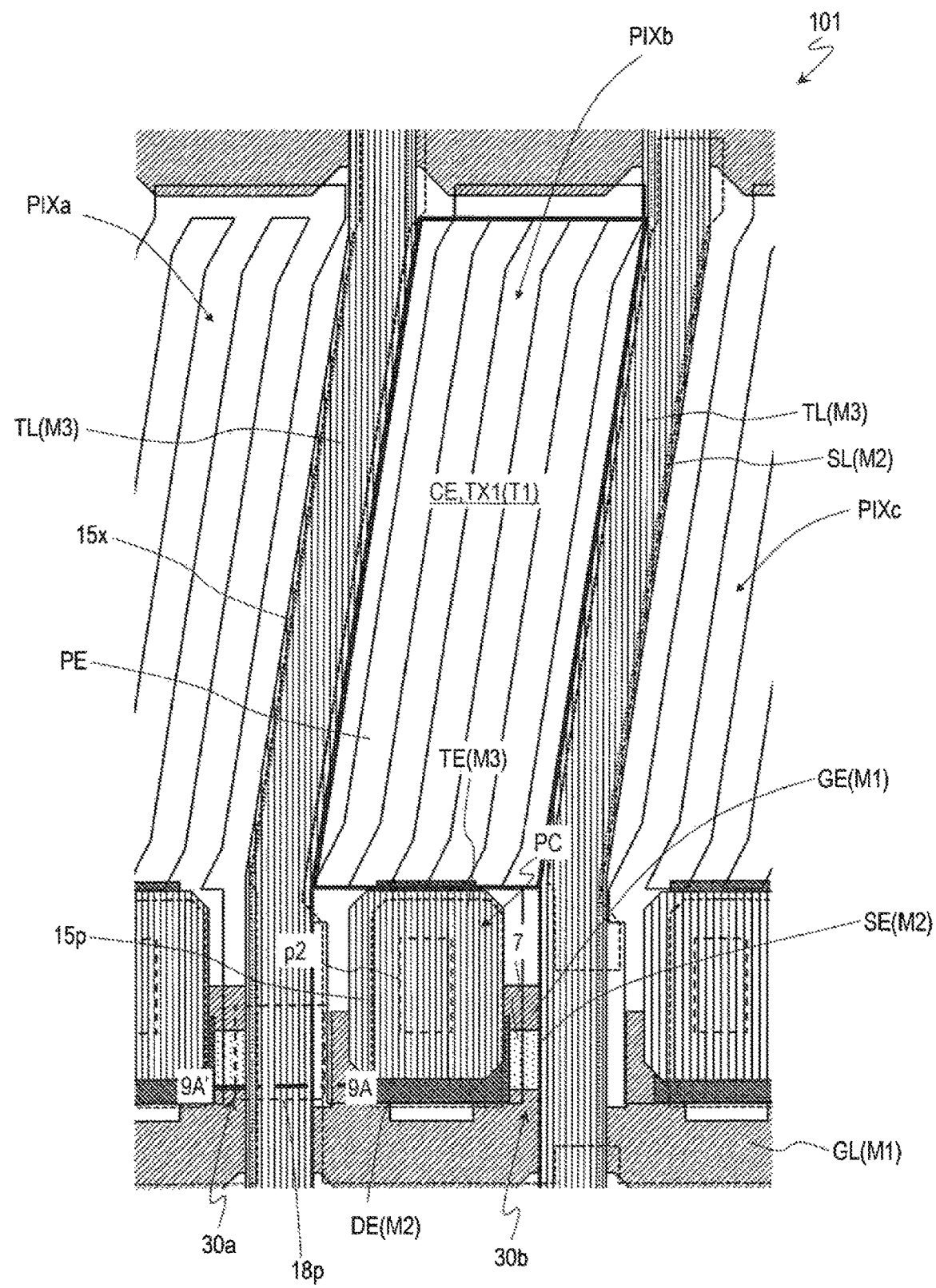
FIG. 8 is a plan view illustrating a part of a display region DR in the active matrix substrate 101.
Figure 9:
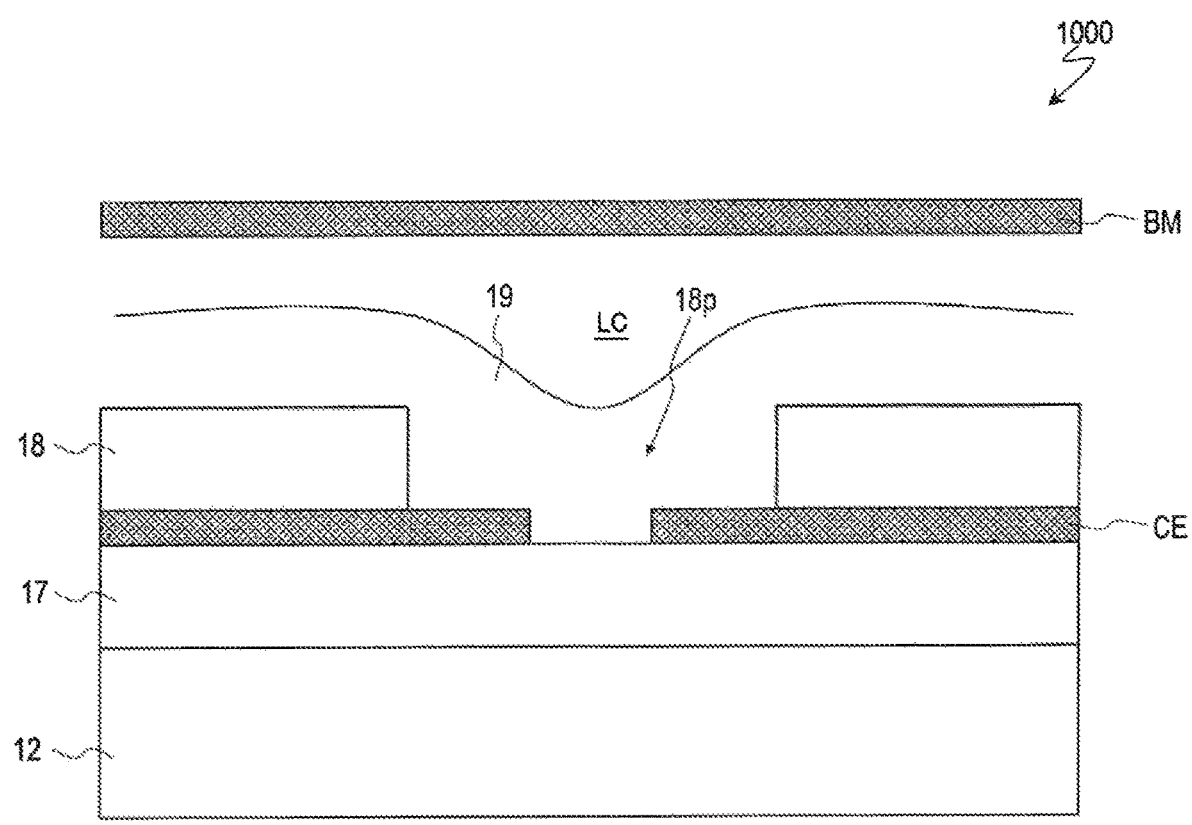
FIG. 9 is a cross-sectional view illustrating a portion at or near the opening 18$p$ in the touch panel 1000, and corresponds to a cross section taken along a line 9A-9A' in FIG. 8.

FIG. 8 and FIG. 9 illustrate another example of the arrangement of the opening 18p. In this example, the opening 18p is formed in a region overlapping the TFT 30a of a pixel region PXa, and includes a portion overlapping the common electrode CE and a portion not overlapping the common electrode CE when viewed from the substrate plane normal direction of the substrate 1. Even in the case where the opening 18p is arranged in this manner, it is possible to obtain the effect of making it easy to release charges accumulated at the interface between the pixel electrode PE and the alignment film 19. Also in this arrangement example, since the entirety of the opening 18p overlaps the black matrix BM, a decrease in contrast ratio due to the step caused by the opening 18p can be suppressed. However, when the portion not overlapping the common electrode CE is included in the opening 18p, the opening 18p is made deep. Thus, the alignment film material is unlikely to enter into the opening portion 18p, and a path through which charges are released may be unlikely to be formed. According to this, from the viewpoint of more reliably forming a path through which charges are released, as illustrated in FIG. 7, it is preferable that the entirety of the opening 18p overlap the common electrode CE when viewed from the substrate plane normal direction of the substrate 1.

Figure 10:
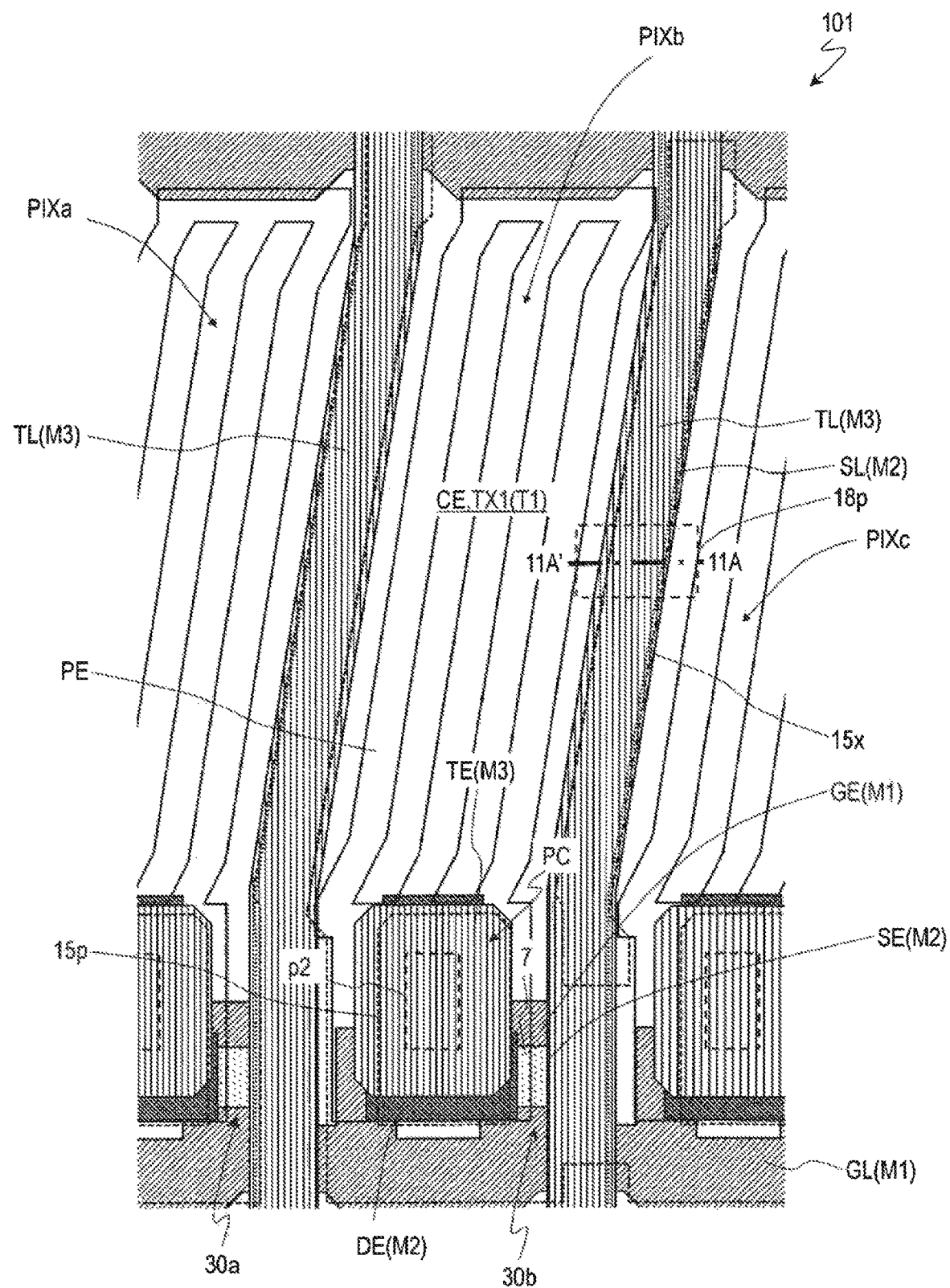
FIG. 10 is a plan view illustrating a part of the display region DR in the active matrix substrate 101.
Figure 11:
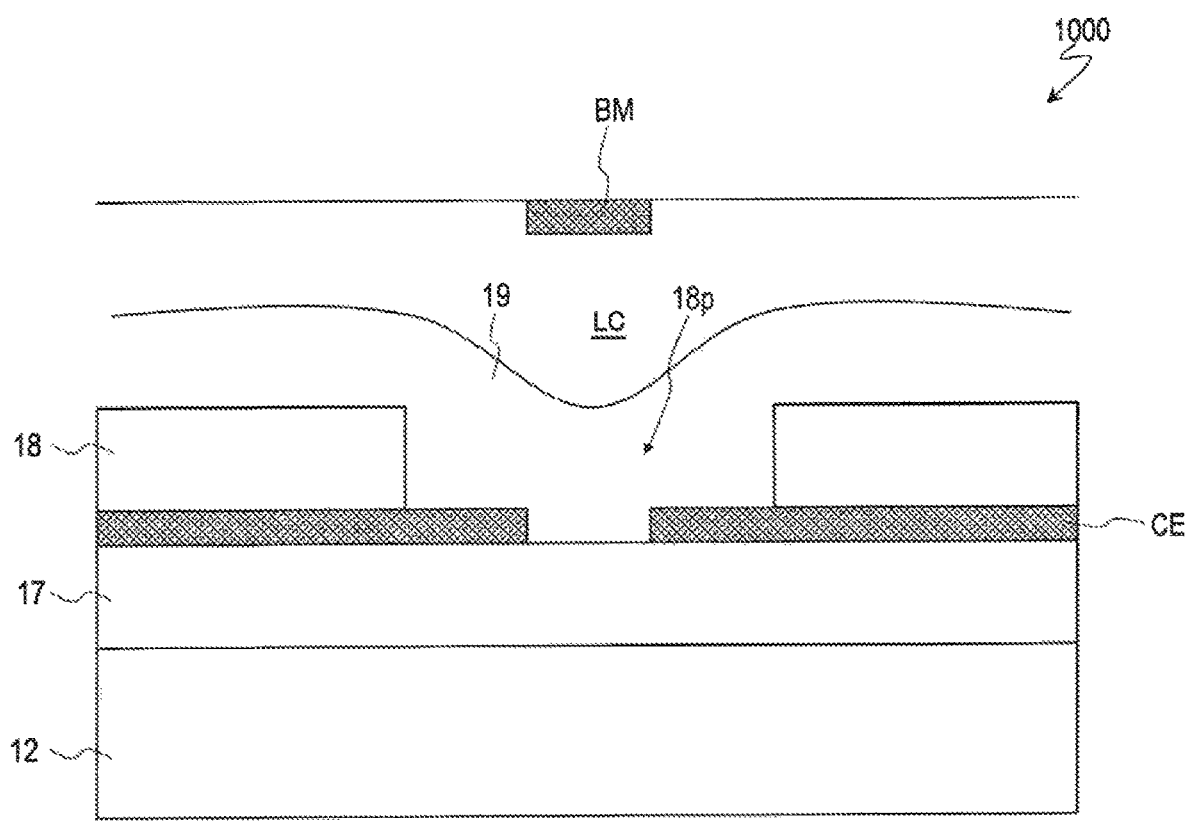
FIG. 11 is a cross-sectional view illustrating a portion at or near the opening 18$p$ in the touch panel 1000, and corresponds to a cross section taken along a line 11A-11A' in FIG. 10.

FIG. 10 and FIG. 11 illustrate still another example of the arrangement of the opening 18p. In this example, the opening 18p is formed in a region that does not overlap the TFT 30a, and includes a portion that overlaps the common electrode CE and a portion that does not overlap the common electrode CE when viewed from the substrate plane normal direction of the substrate 1. Even in the case where the opening 18p is arranged in this manner, it is possible to obtain the effect of making it easy to release charges accumulated at the interface between the pixel electrode PE and the alignment film 19. However, since the portion that does not overlap the common electrode CE is included in the opening 18p, the opening 18p is made deep, and the alignment film material is unlikely to enter into the opening 18p, which may make it difficult to form a path through which charges are released. Further, in this arrangement example, when viewed from the substrate plane normal direction of the substrate 1, the opening 18p includes a portion overlapping the black matrix BM and a portion not overlapping the black matrix BM. When the opening 18p includes a portion that does not overlap the black matrix BM, a decrease in contrast ratio may occur due to the step caused by the opening 18p. Thus, from the viewpoint of suppressing the decrease in contrast ratio, as illustrated in FIG. 7 and FIG. 9, it is preferable that the entirety of the opening 18p overlap the black matrix BM when viewed from the substrate plane normal direction of the substrate 1.

Figure 12:
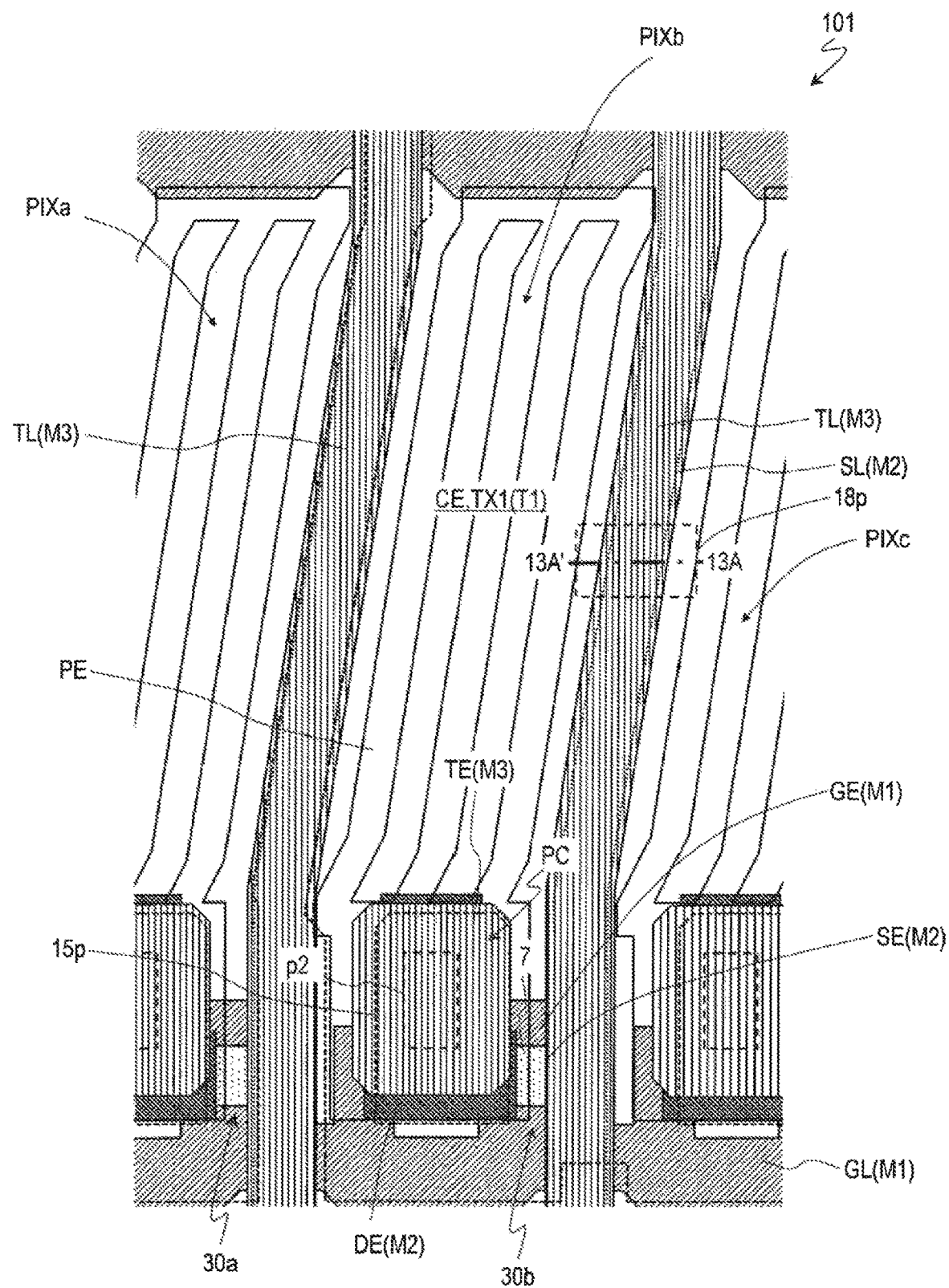
FIG. 12 is a plan view illustrating a part of the display region DR in the active matrix substrate 101.
Figure 13:
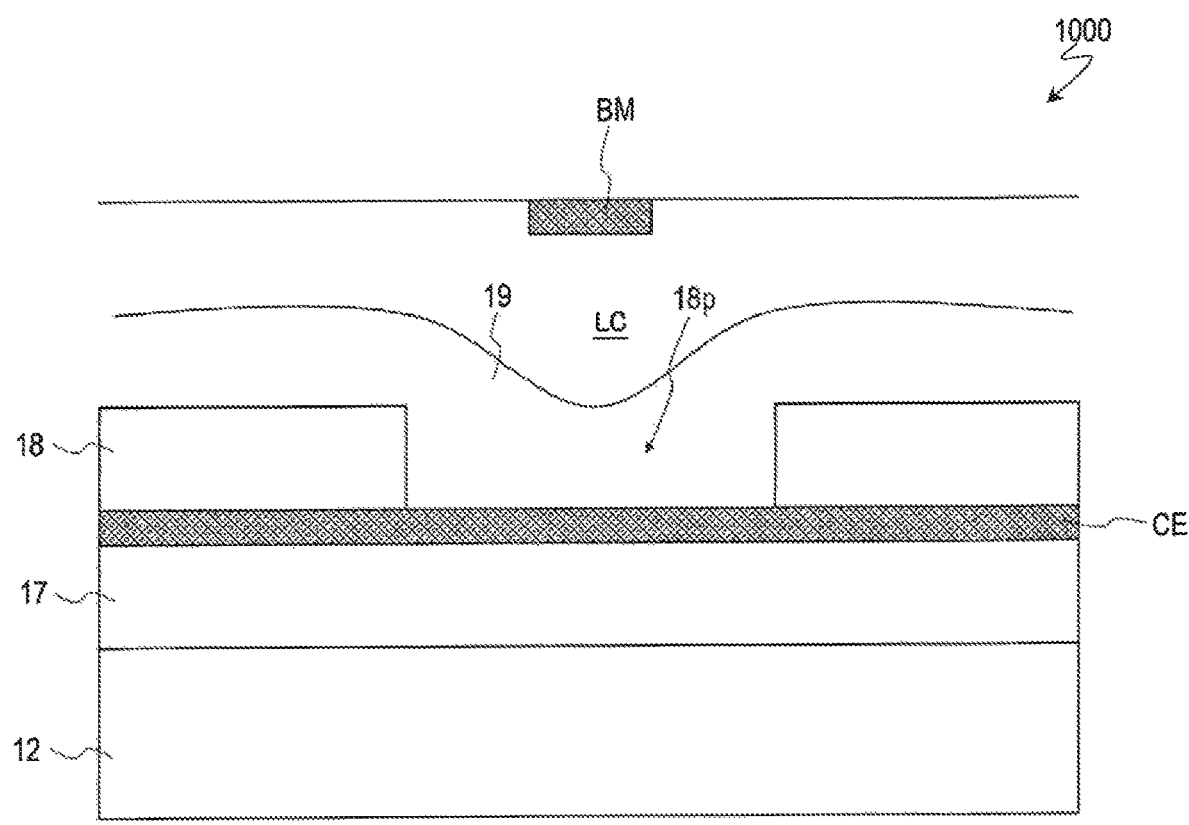
FIG. 13 is a cross-sectional view illustrating a portion at or near the opening 18$p$ in the touch panel 1000, and corresponds to a cross section taken along a line 13A-13A' in FIG. 12.

FIG. 12 and FIG. 13 illustrate still another example of the arrangement of the opening 18p. In this example, the opening 18p is formed in a region that does not overlap the TFT 30a. In addition, in this example, since the common electrode CE does not include an opening 15x between a pixel region PXb and a pixel region PXc, the entirety of the opening 18p overlaps the common electrode CE when viewed from the substrate plane normal direction of the substrate 1. Even in the case where the opening 18p is arranged in this manner, it is possible to obtain the effect of making it easy to release charges accumulated at the interface between the pixel electrode PE and the alignment film 19. In addition, in this arrangement example, since the entirety of the opening 18p overlaps the common electrode CE, the opening 18p is relatively shallow. Thus, since the alignment film material easily enters into the opening 18p, a path through which charges are released is easily formed. However, in this arrangement example, since the opening 18p includes a portion that does not overlap the black matrix BM, a decrease in contrast ratio may occur due to the step caused by the opening 18p.

Note that, in the description described above, the example has been described in which the pixel electrode PE is electrically connected to the drain electrode DE through the connection electrode TE formed by using the same third conductive film as the touch wiring line TL (that is, formed in the third metal layer M3), but the embodiment of the disclosure is not limited to this configuration.

Manufacturing Method of Active Matrix Substrate 101

Next, an example of a manufacturing method of the active matrix substrate 101 will be described with reference to FIG. 14A to FIG. 14I and FIG. 15. FIG. 14A to FIG. 14I are process cross-sectional views illustrating the manufacturing method of the active matrix substrate 101. FIG. 15 is a flowchart illustrating the manufacturing method of the active matrix substrate 101. As illustrated in FIG. 15, in this example, a photolithography process is performed 10 times (by using 10 photomasks).

Figure 14A:
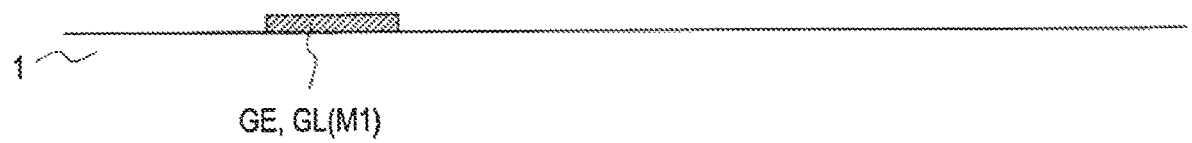
FIG. 14A is a process cross-sectional view illustrating a manufacturing method of the active matrix substrate 101.

Formation of First Metal Layer M1 (FIG. 14A)

As illustrated in FIG. 14A, the first metal layer M1 is formed on the substrate 1. First, the first conductive film (for example, having a thickness being equal to or greater than 50 nm and equal to or less than 500 nm) is formed on the substrate 1 by, for example, sputtering. Subsequently, by known photolithography techniques, a resist mask is formed and the first conductive film is patterned (for example, wet etching). Thereafter, the resist mask is peeled off. In this way, the first metal layer M1 including the gate bus line GL and the gate electrode GE is formed.

As the substrate 1, a transparent substrate with insulating properties, for example, a glass substrate, a silicon substrate, a heat-resistant plastic substrate (resin substrate), or the like can be used.

The material of the first conductive film is not limited, and a film containing metal such as aluminum (Al), tungsten (W), molybdenum (Mo), tantalum (Ta), chromium (Cr), titanium (Ti), copper (Cu) or the like, an alloy thereof, or metal nitride thereof can be appropriately used. In addition, a layered film obtained by layering these plurality of films may be used.

Figure 14B:
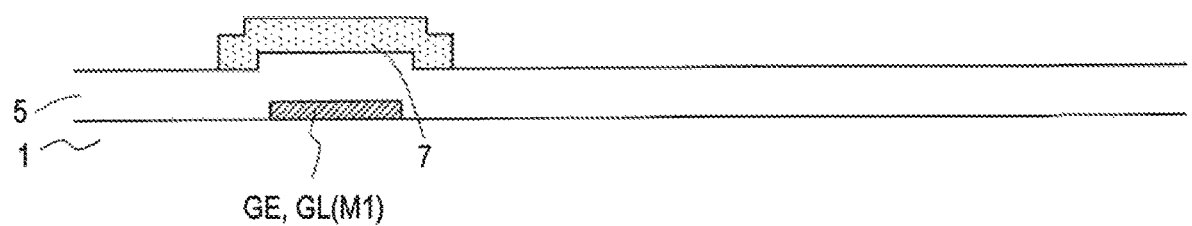
FIG. 14B is a process cross-sectional view illustrating the manufacturing method of the active matrix substrate 101.

Formation of Gate Insulating Layer 5 and Oxide Semiconductor Layer 7 (FIG. 14B)

Subsequently, as illustrated in FIG. 14B, the gate insulating layer 5 (for example, having a thickness being equal to or greater than 200 nm and equal to or less than 600 nm) is formed so as to cover the first metal layer M1, and then the oxide semiconductor layer 7 is formed on the gate insulating layer 5.

The gate insulating layer 5 is formed by, for example, CVD. As the gate insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The gate insulating layer 5 may be a single layer or may have a layered structure. For example, a silicon nitride (SiNx) layer, a silicon nitride oxide layer, or the like may be formed on a substrate side (as a lower layer) in order to prevent diffusion of impurities and the like from the substrate 1, and a silicon oxide ($SiO_2$) layer, a silicon oxynitride layer, or the like may be formed on the top of the lower layer (as an upper layer) in order to ensure insulating properties. Here, as the gate insulating layer 5, a layered film having a silicon nitride (SiNx) layer (having a thickness of 50 to 600 nm) as the lower layer and a silicon oxide ($SiO_2$) layer (having a thickness of 50 to 600 nm) as the upper layer is formed. When an oxide film such as a silicon oxide film is used as the gate insulating layer 5 (or as the top layer of the gate insulating layer 5 when the gate insulating layer 5 has a layered structure), the oxide film can reduce the oxygen deficit generated in a channel region of the oxide semiconductor layer to be formed later, thereby suppressing resistance reduction of the channel region.

The oxide semiconductor layer 7 may be formed, for example, as follows. First, the oxide semiconductor film (not illustrated) is formed on the gate insulating layer 5. Thereafter, annealing treatment of the oxide semiconductor film may be performed. A thickness of the oxide semiconductor film may be, for example, equal to or greater than 15 nm and equal to or less than 200 nm. The oxide semiconductor film may be formed by sputtering, for example. Here, as the oxide semiconductor film, an In—Ga—Zn—O-based semiconductor film (having a thickness of 50 nm) film containing In, Ga, and Zn is formed.

Subsequently, the oxide semiconductor film is patterned by a known photolithography process. In this manner, the oxide semiconductor layer 7 to be an active layer of the TFT 30 is formed in the pixel region PIX.

First Etching of Gate Insulating Layer 5

Subsequently, the gate insulating layer 5 is patterned by a known photolithography process. Thus, an opening is formed in a region where a source-gate connection section is to be formed.

Figure 14C:
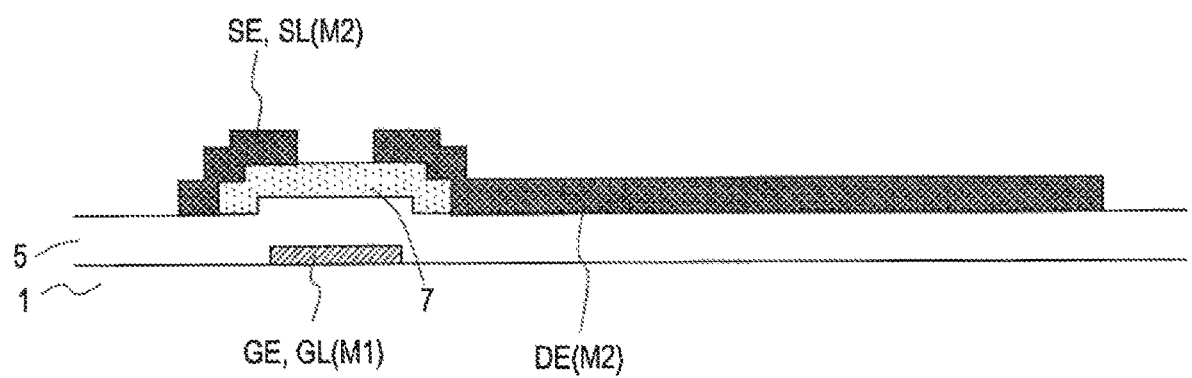
FIG. 14C is a process cross-sectional view illustrating the manufacturing method of the active matrix substrate 101.

Formation of Second Metal Layer M2 (FIG. 14C)

Subsequently, as illustrated in FIG. 14C, the second metal layer M2 is formed. First, the second conductive film (for example, having a thickness being equal to or greater than 50 nm and equal to or less than 500 nm) is formed on the oxide semiconductor layer 7 by sputtering or the like. Thereafter, the second conductive film is patterned by a known photolithography process. According to this, the second metal layer M2 including the source electrode SE, the drain electrode DE, and the source bus line SL can be obtained. In this way, the TFT 30 is formed in the pixel region PIX.

As the second conductive film, for example, an element selected from aluminum (Al), chromium (Cr), copper (Cu), tantalum (Ta), titanium (Ti), molybdenum (Mo), and tungsten (W), an alloy containing some of these elements, or the like can be used. The source conductive film may have a single layer structure or a layered structure.

Figure 14D:
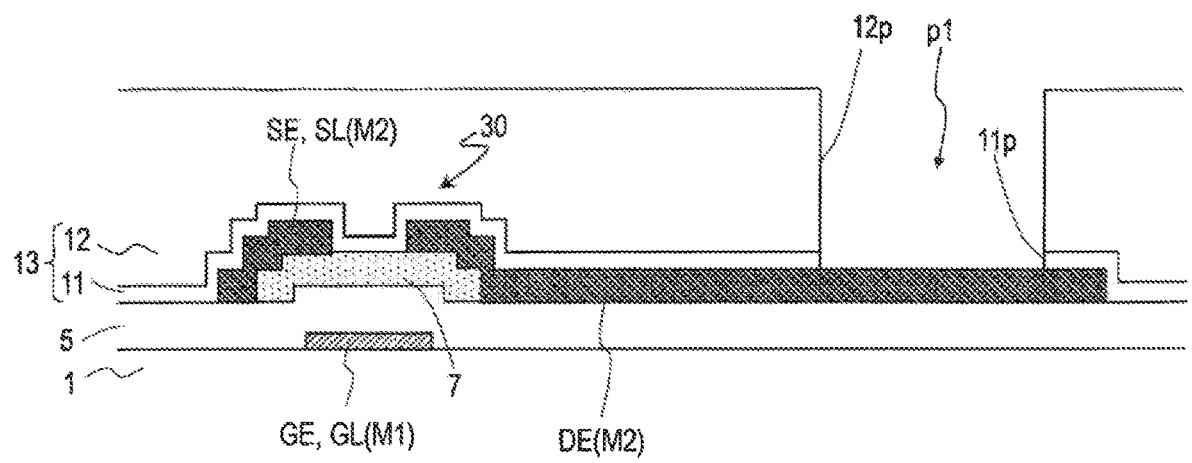
FIG. 14D is a process cross-sectional view illustrating the manufacturing method of the active matrix substrate 101.

Formation of Interlayer Insulating Layer 13 (FIG. 14D)

After forming the second metal layer M2, the interlayer insulating layer 13 is formed on the TFT 30 by CVD or the like. In the embodiment, as the interlayer insulating layer 13, the inorganic insulating layer (for example, having a thickness being equal to or greater than 0.1 μm and equal to or less than 1 μm) 11 and the organic insulating layer (for example, having a thickness being equal to or greater than 1 μm and equal to or less than 3 μm) 12 are formed in this order.

The inorganic insulating layer 11 can be formed as a single layer of a silicon oxide film, a silicon nitride film, a silicon oxynitride film, a silicon nitride oxide film, aluminum oxide, or tantalum oxide, or a multi-layer thereof.

Next, the organic insulating layer 12 including an opening 12p is formed on the inorganic insulating layer 11. The organic insulating layer 12 can be formed by, for example, applying a positive photosensitive resin material (for example, an acrylic resin material) on the inorganic insulating layer 11, followed by exposing/developing and baking. The opening 12p is formed in the pixel region PIX at a position overlapping the drain electrode DE when viewed from the normal direction of the substrate 1. The organic insulating layer 12 does not need to be formed at a part of the non-display region FR.

Then, the inorganic insulating layer 11 is etched (dry-etched) using the organic insulating layer 12 as a mask. In this way, in the pixel region PIX, the lower opening p1 that exposes a part of the drain electrode DE is obtained. The lower opening p1 includes the opening 12p in the organic insulating layer 12 and an opening 11p in the inorganic insulating layer 11. At a side surface of the lower opening p1, a side surface of the organic insulating layer 12 and a side surface of the inorganic insulating layer 11 may be aligned with each other.

Figure 14E:
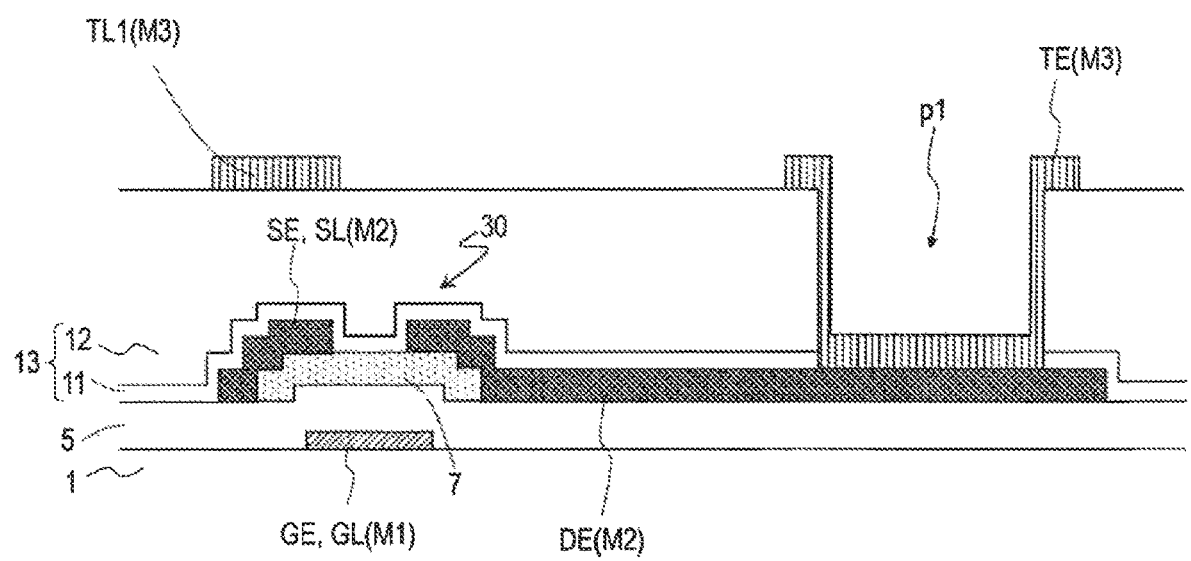
FIG. 14E is a process cross-sectional view illustrating the manufacturing method of the active matrix substrate 101.

Formation of Third Metal Layer M3 (FIG. 14E)

Subsequently, the third metal layer M3 is formed. Here, the third conductive film is formed on the interlayer insulating layer 13 and in the lower opening p1. Thereafter, the third conductive film is patterned by a known photolithography process. Here, the third conductive film is patterned by wet etching. In this way, the touch wiring line TL, and the connection electrode TE in contact with the drain electrode DE in the lower opening p1 are obtained.

As the third conductive film, a conductive film (having a thickness of 50 nm to 500 nm) similar to the first conductive film or the second conductive film can be used. For example, a single layer or a layered film made mainly of Cu or Al may be formed by sputtering. Alternatively, as the third conductive film, for example, a layered film including a transparent conductive film (for example, having a thickness being equal to or greater than 10 nm and equal to or less than 50 nm) and a metal film arranged on the transparent conductive film (for example, having a thickness being equal to or greater than 100 nm and equal to or less than 400 nm) can be used. As the transparent conductive film, a film similar to that used for the pixel electrode PE or the common electrode CE, which will be described later, can be used. As the metal film, a metal film similar to that used for the first metal layer M1 or the second metal layer M2 can be used. In this example, as the third conductive film, a layered film having an indium-tin oxide (ITO) film as a lower layer and a Cu film as an upper layer is formed by sputtering.

Figure 14F:
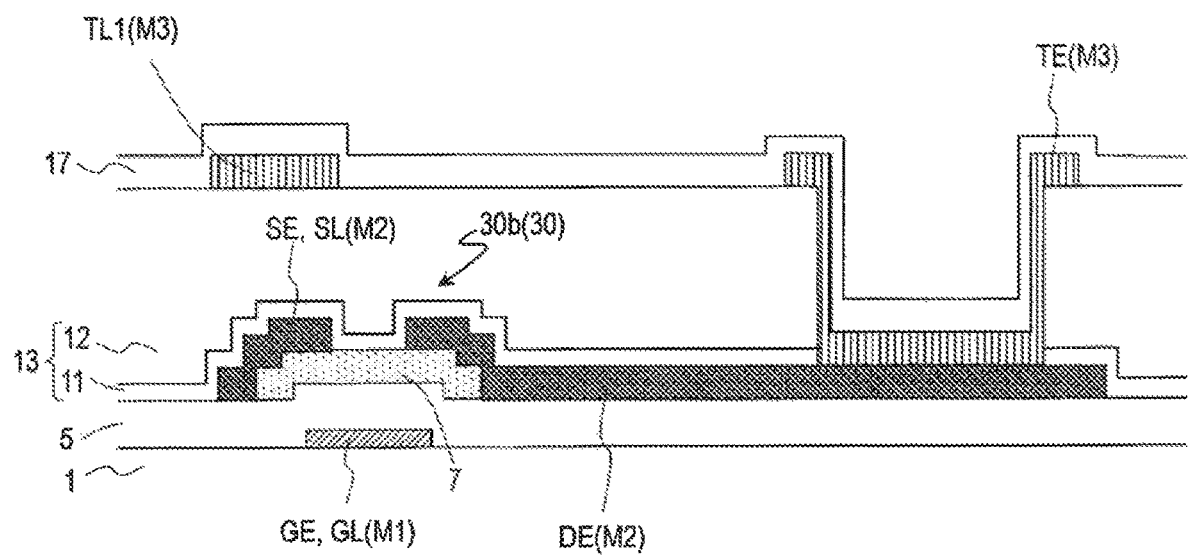
FIG. 14F is a process cross-sectional view illustrating the manufacturing method of the active matrix substrate 101.

Formation of Second Dielectric Layer 17 (FIG. 14F)

Subsequently, as illustrated in FIG. 14F, the second dielectric film (having a thickness being equal to or greater than 100 nm and equal to or less than 500 nm) is formed so as to cover the third metal layer M3, and patterned by a known photolithography process to obtain the second dielectric layer 17. Here, dry etching is used for patterning the second dielectric film. As a result, an opening for exposing a part of the touch wiring line TL (for electrically connecting the touch wiring line TL and the touch sensor electrode TX) is formed.

The second dielectric layer 17 may be, for example, a silicon oxide film, a silicon nitride film, a silicon oxynitride film, or a silicon nitride oxide film, or a layered film including at least one of these films. Here, as the second dielectric layer 17, for example, a silicon nitride (SiNx) film is formed by CVD. The thickness of the second dielectric layer 17 is set in consideration of the touch wiring line capacity, as described above.

Figure 14G:
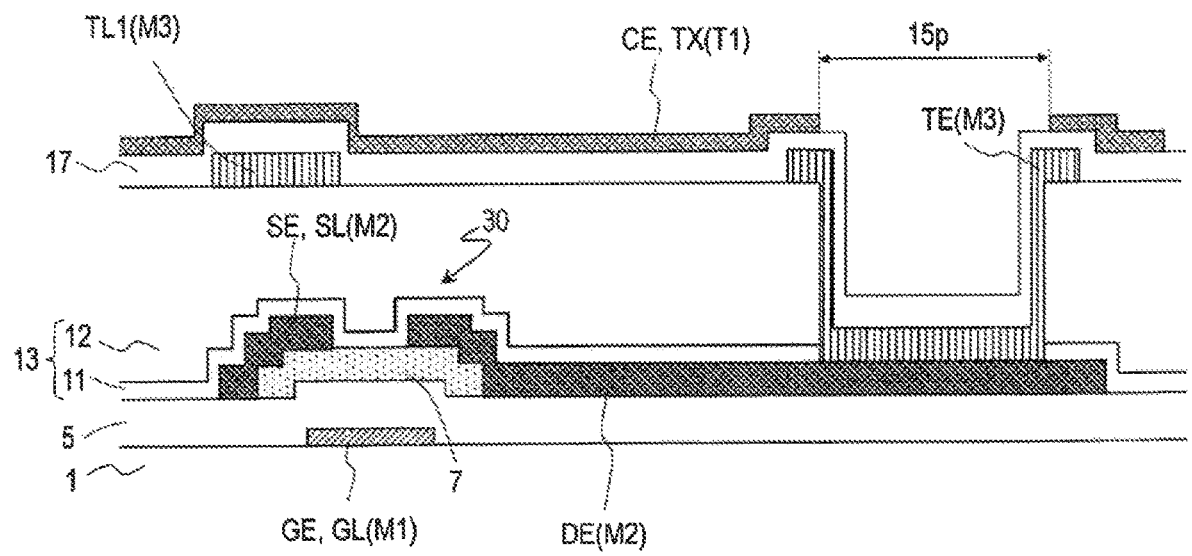
FIG. 14G is a process cross-sectional view illustrating the manufacturing method of the active matrix substrate 101.

Formation of First Transparent Conductive Layer T1 (FIG. 14G)

Subsequently, as illustrated in FIG. 14G, the first transparent conductive layer T1 including the common electrode CE is formed on the second dielectric layer 17. First, a first transparent conductive film (having a thickness of 20 to 300 nm) (not illustrated) is formed on the second dielectric layer 17 by, for example, sputtering. The first transparent conductive film can be made of metal oxide such as indium-tin oxide (ITO), indium-zinc oxide, ZnO or the like.

Thereafter, the first transparent conductive film is patterned. For example, wet etching may be performed using an oxalic acid-based etching solution. In this way, the common electrode CE is obtained, and the common electrode CE is divided into a plurality of segments each of which functions as the touch sensor electrode TX. Each touch sensor electrode TX is connected to the touch wiring line TL in the opening of the second dielectric layer 17. Further, the common electrode CE includes the opening 15p in a region where the pixel contact portion PC is formed.

Figure 14H:
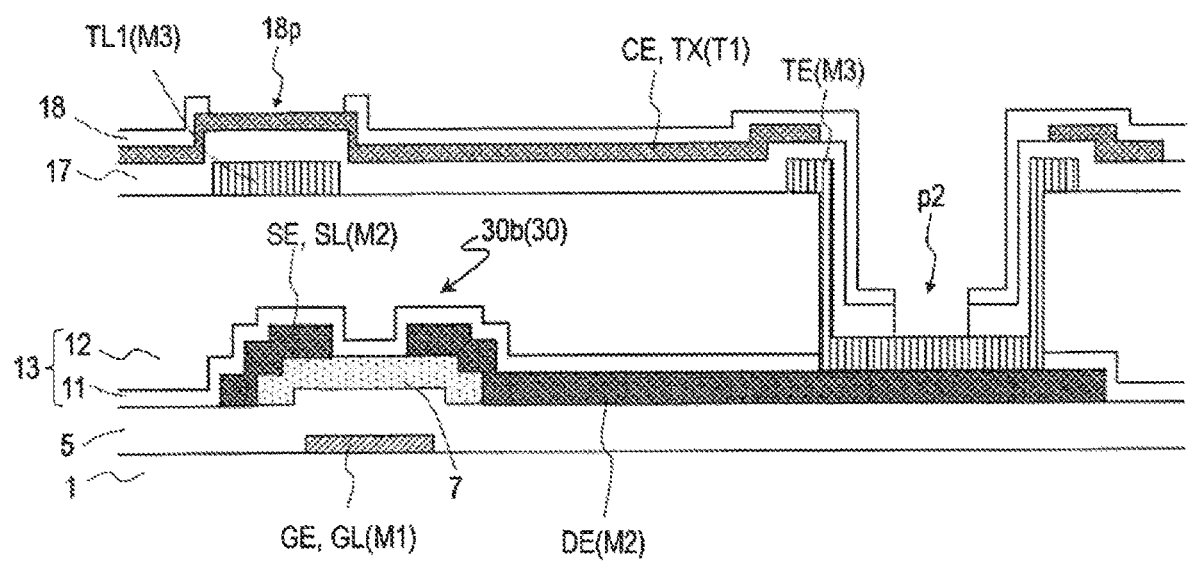
FIG. 14H is a process cross-sectional view illustrating the manufacturing method of the active matrix substrate 101.

Formation of Second Dielectric Layer 18 (FIG. 14H)

Subsequently, as illustrated in FIG. 14H, the first dielectric film (having a thickness being equal to or greater than 80 nm and equal to or less than 250 nm) is formed so as to cover the common electrode CE, and patterned by a known photolithography process to obtain the first dielectric layer 18. Here, dry etching is used for patterning the first dielectric film. In this way, in a region where the pixel contact portion PC is formed, the first dielectric layer 18 and the second dielectric layer 17 are simultaneously etched, and the upper opening p2 that exposes a part of the connection electrode TE is formed. In addition, the first dielectric layer 18 is etched in a region overlapping the TFT 30 (more specifically, a region overlapping the source electrodes SE) to form the opening 18p that exposes a part of the common electrode CE.

The first dielectric layer 18 may be, for example, a silicon oxide film, a silicon nitride film, a silicon oxynitride film, or a silicon nitride oxide film, or a layered film including at least one of these films. The material of the first dielectric layer 18 may be the same as the material of the second dielectric layer 17. Here, as the first dielectric layer 18, for example, a silicon nitride (SiNx) film is formed by CVD.

Figure 14I:
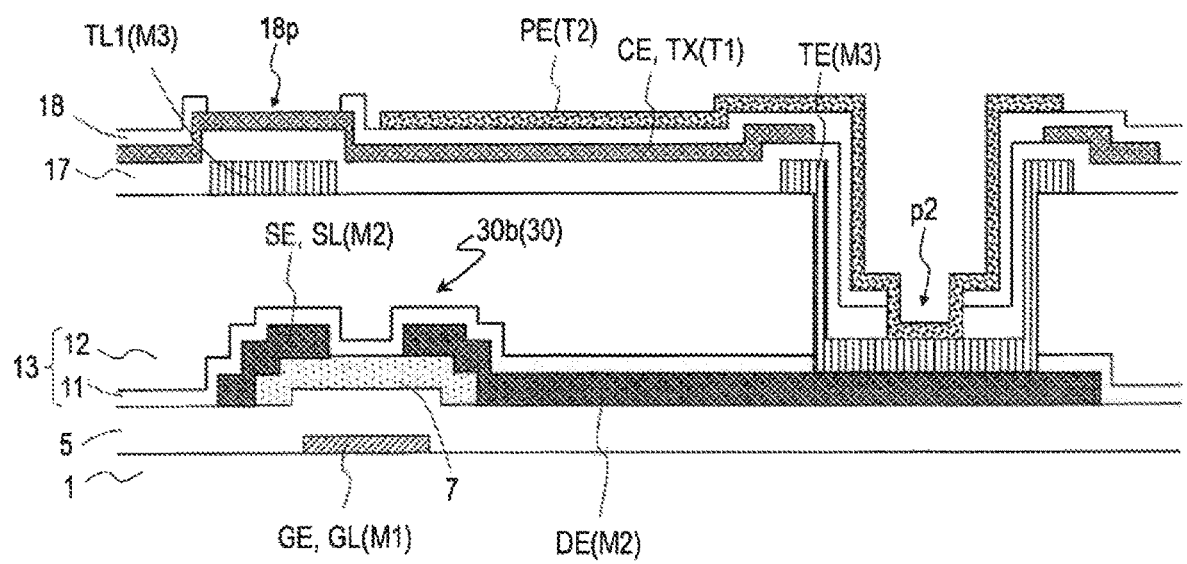
FIG. 14I is a process cross-sectional view illustrating the manufacturing method of the active matrix substrate 101.

Formation of Pixel Electrode PE (FIG. 14I)

Subsequently, the second transparent conductive layer T2 including the pixel electrode PE is formed on the first dielectric layer 18. First, a second transparent conductive film (having a thickness of 20 to 300 nm) (not illustrated) is formed on the second dielectric layer 18 and in the upper opening p2. A material of the second transparent conductive film may be the same as the material exemplified as the material of the first transparent conductive film (for example, ITO).

Thereafter, the second transparent conductive film is patterned. The second transparent conductive film may be wet-etched using an oxalic acid-based etching solution, for example. In this way, as illustrated in FIG. 14I, the pixel electrode PE is obtained.

The pixel electrode PE is connected to the connection electrode TE in the upper opening p2. In the pixel electrode PE, at least one slit or notched portion is formed in the pixel region PIX. The pixel electrodes PE are separated for each pixel region PIX. Each pixel electrode PE is formed on the first dielectric layer 18 and in the upper opening p2, and is electrically connected to the drain electrode DE through the connection electrode TE. In this way, the pixel contact portion PC is obtained. Thereafter, the alignment film 19 is formed so as to cover the pixel electrode PE, thereby completing the active matrix substrate 101.

Second Embodiment

Figure 16:
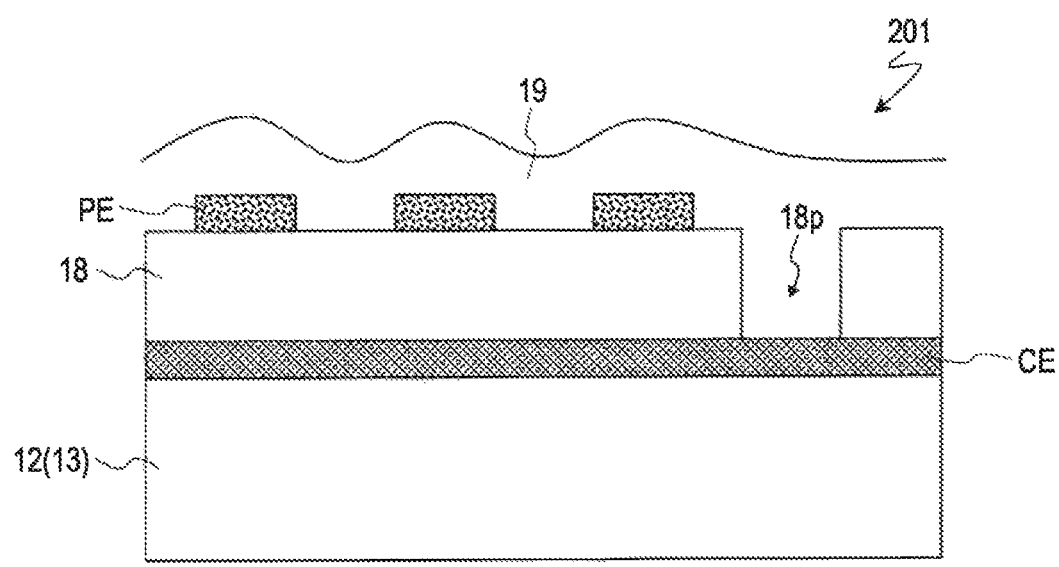
FIG. 16 is a cross-sectional view schematically illustrating another active matrix substrate 201 according to an embodiment of the disclosure.

An active matrix substrate 201 in the present embodiment will be described with reference to FIG. 16. FIG. 16 is a cross-sectional view schematically illustrating the active matrix substrate 201.

In the first embodiment, the active matrix substrate 101 for the touch panel 1000 of the in-cell type is exemplified, but the embodiments of the disclosure are not limited to the active matrix substrate for the in-cell type touch panel.

The active matrix substrate 201 illustrated in FIG. 16 is not for the in-cell type touch panel, and does not include the touch wiring line TL and the second dielectric layer 17. Also in a liquid crystal display device other than the in-cell type touch panel, charges may be easily accumulated at an interface between a pixel electrode and an alignment film in an active matrix substrate having a common lower layer structure depending on the specifications or the like. However, as in the active matrix substrate 201 according to the present embodiment, the first dielectric layer 18 arranged between the pixel electrode PE and the common electrode CE includes the plurality of openings 18p each of which exposes a part of the common electrode CE, so that charges accumulated at the interface between the pixel electrode PE and the alignment film 19 can be easily released.

Also in the active matrix substrate 201, since the opening 18p of the first dielectric layer 18 can be simultaneously formed in the process for forming the pixel contact portion, it is not necessary to add a separate process.

Oxide Semiconductor

The oxide semiconductor (also referred to as a metal oxide, or an oxide material) included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer.

Alternatively, the oxide semiconductor layer may include a plurality of crystalline oxide semiconductor layers having different crystal structures. Also, the oxide semiconductor layer may include a plurality of amorphous oxide semiconductor layers. When the oxide semiconductor layer has a dual-layer structure that includes an upper layer and a lower layer, an energy gap of the oxide semiconductor included in a layer positioned at the gate electrode side of the two layers (that is, the lower layer in a case of a bottom gate structure, and the upper layer in a case of a top gate structure) may be smaller than an energy gap of the oxide semiconductor included in a layer positioned opposite to the gate electrode (that is, the upper layer in the case of the bottom gate structure, and the lower layer in the case of the top gate structure). Note that, in a case where a difference in the energy gap between these layers is relatively small, the energy gap of the oxide semiconductor included in the layer positioned at the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O-based semiconductor (for example, an indium gallium zinc oxide). Here, the In—Ga—Zn—O-based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer can be formed of an oxide semiconductor film including an In—Ga—Zn—O-based semiconductor.

The In—Ga—Zn—O-based semiconductor may be an amorphous semiconductor or may be a crystalline semiconductor. A crystalline In—Ga—Zn—O-based semiconductor in which a c-axis is oriented substantially perpendicular to a layer surface is preferable as the crystalline In—Ga—Zn—O-based semiconductor.

Note that a crystal structure of the crystalline In—Ga—Zn—O-based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O-based semiconductor layer has a high mobility (more than 20 times as compared to an a-Si TFT) and a low leakage current (less than 1/100 as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O-based semiconductor, the oxide semiconductor layer may include another oxide semiconductor. For example, the oxide semiconductor layer may include an In—Sn—Zn—O-based semiconductor (for example, $In_2O_3$—$SnO_2$—ZnO; InSnZnO). The In—Sn—Zn—O-based semiconductor is a ternary oxide of indium (In), tin (Sn), and zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, an In—W—Zn—O-based semiconductor, and the like.

INDUSTRIAL APPLICABILITY

According to the embodiments of the disclosure, there is provided an active matrix substrate having a common lower layer structure in which charges accumulated at an interface between a pixel electrode and an alignment film are easily removed compared with that in the related art.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising;
    a substrate;
    a plurality of thin film transistors supported by the substrate, each of the plurality of thin film transistors including an oxide semiconductor layer;
    an interlayer insulating layer covering the plurality of thin film transistors;
    a plurality of pixel electrodes provided above the interlayer insulating layer, each of the plurality of pixel electrodes being electrically connected to a corresponding one of the plurality of thin film transistors;
    a common electrode provided between the plurality of pixel electrodes and the interlayer insulating layer;
    a first dielectric layer provided between the common electrode and the plurality of pixel electrodes; and
    an alignment film covering the plurality of pixel electrodes, wherein:
        the first dielectric layer includes a plurality of openings,
        each of the plurality of openings exposes a part of the common electrode,
        each of the plurality of openings includes the alignment film positioned in each opening, and each of the plurality of openings further includes a portion overlapping the common electrode and a portion not overlapping the common electrode when viewed from a direction normal to the substrate.

2. The active matrix substrate according to claim 1, wherein the plurality of openings is formed at an arrangement density being equal to or more than 1 opening/mm$^2$.

3. The active matrix substrate according to claim 1, wherein the plurality of openings is formed at an arrangement density being equal to or more than 4 openings/mm$^2$.

4. The active matrix substrate according to claim 1, further comprising:
   a plurality of touch wiring lines for a touch sensor provided between the interlayer insulating layer and the common electrode; and
   a second dielectric layer provided between the interlayer insulating layer and the common electrode, the second dielectric layer covering the plurality of touch wiring lines, wherein
   the common electrode includes a plurality of common electrode portions each of which is configured to function as an electrode for the touch sensor.

5. The active matrix substrate according to claim 1, wherein the oxide semiconductor layer includes an In—Ga—Zn—O-based semiconductor.

6. A liquid crystal display device comprising:
   the active matrix substrate according to claim 1;
   a counter substrate facing the active matrix substrate; and
   a liquid crystal layer provided between the active matrix substrate and the counter substrate.

7. The liquid crystal display device according to claim 6, wherein the counter substrate includes a black matrix, and
   an entirety of each of the plurality of openings of the first dielectric layer overlaps the black matrix when viewed from a direction normal to the substrate.

8. A liquid crystal display device comprising:
   an active matrix substrate that includes:
      a substrate,
      a plurality of thin film transistors supported by the substrate, each of the plurality of thin film transistors including an oxide semiconductor layer,
      an interlayer insulating layer covering the plurality of thin film transistors,
      a plurality of pixel electrodes provided above the interlayer insulating layer, each of the plurality of pixel electrodes being electrically connected to a corresponding one of the plurality of thin film transistors,
      a common electrode provided between the plurality of pixel electrodes and the interlayer insulating layer,
      a first dielectric layer provided between the common electrode and the plurality of pixel electrodes, and
      an alignment film covering the plurality of pixel electrodes,
   a counter substrate facing the active matrix substrate; and
   a liquid crystal layer provided between the active matrix substrate and the counter substrate, wherein:
      the first dielectric layer includes a plurality of openings,
      each of the plurality of openings exposes a part of the common electrode,
      each of the plurality of openings includes the alignment film positioned in each opening,
      the counter substrate includes a black matrix, and
      each of the plurality of openings of the first dielectric layer further includes a portion overlapping the black matrix and a portion not overlapping the black matrix when viewed from a direction normal to the substrate.

* * * * *